(12) United States Patent
Hwang et al.

(10) Patent No.: US 12,278,281 B2
(45) Date of Patent: Apr. 15, 2025

(54) HIGH ELECTRON MOBILITY TRANSISTOR

(71) Applicant: Samsung Electronics Co., Ltd., Suwon-si (KR)

(72) Inventors: Sunkyu Hwang, Seoul (KR); Jaejoon Oh, Seongnam-si (KR); Jongseob Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 778 days.

(21) Appl. No.: 17/475,700

(22) Filed: Sep. 15, 2021

(65) Prior Publication Data
US 2022/0376102 A1 Nov. 24, 2022

(30) Foreign Application Priority Data

May 18, 2021 (KR) .................. 10-2021-0064214

(51) Int. Cl.
*H01L 29/778* (2006.01)
*H01L 29/20* (2006.01)
(Continued)

(52) U.S. Cl.
CPC ...... *H01L 29/7786* (2013.01); *H01L 29/2003* (2013.01); *H01L 29/205* (2013.01); *H01L 29/475* (2013.01)

(58) Field of Classification Search
CPC ... H01L 29/15–158; H01L 29/122–127; H01L 29/4958; H01L 29/66431;
(Continued)

(56) References Cited

U.S. PATENT DOCUMENTS 9,012,319 B1 4/2015 Choi et al.
10,396,153 B2 8/2019 Ueda
(Continued)

FOREIGN PATENT DOCUMENTS

JP 2012/190996 A 10/2012
JP 6240898 B2 12/2017
(Continued)

OTHER PUBLICATIONS

Injun Hwang et al., "p-GaN gate HEMTs with tungsten gate metal for high threshold voltage and low gate current" *IEEE Electron Device Letters*, vol. 34, No. 2, Feb. 2013, pp. 202-204.
(Continued)

*Primary Examiner* — Tucker J Wright
(74) *Attorney, Agent, or Firm* — HARNESS, DICKEY & PIERCE, P.L.C.

(57) ABSTRACT

A high electron mobility transistor (HEMT) includes an active region, in which a channel is formed, and a field region surrounding the active region. The HEMT may include a channel layer; a barrier layer on the channel layer and configured to induce a two-dimensional electron gas (2DEG) in the channel layer; a source and a drain on the barrier layer in the active region; and a gate on the barrier layer. The gate may protrude from the active region to the field region on the barrier layer. The gate may include a first gate and a second gate. The first gate may be in the active region and the second gate may be in the boundary region between the active region and the field region. A work function of the second gate may be different from a work function of the first gate.

20 Claims, 30 Drawing Sheets

(51) Int. Cl.
*H01L 29/205* (2006.01)
*H01L 29/47* (2006.01)

(58) Field of Classification Search
CPC ........... H01L 29/66462; H01L 29/7786; H01L 2924/13064
See application file for complete search history.

(56) References Cited

U.S. PATENT DOCUMENTS

| | | | |
|---|---|---|---|
| 2007/0164314 A1* | 7/2007 | Beach | H01L 29/045 257/E29.253 |
| 2010/0044801 A1 | 2/2010 | Anderson et al. | |
| 2012/0068227 A1 | 3/2012 | Hikita et al. | |
| 2014/0252417 A1* | 9/2014 | Yanagita | H01L 29/2003 257/288 |
| 2019/0115462 A1 | 4/2019 | Teo et al. | |
| 2020/0185506 A1 | 6/2020 | Shirota et al. | |
| 2021/0057564 A1 | 2/2021 | Umeda et al. | |
| 2021/0184010 A1 | 6/2021 | Chong et al. | |
| 2021/0193825 A1 | 6/2021 | Liu et al. | |
| 2021/0399120 A1 | 12/2021 | Hwang et al. | |

FOREIGN PATENT DOCUMENTS

| | | |
|---|---|---|
| JP | 2018/174196 A | 11/2018 |
| JP | 2020/92193 A | 6/2020 |
| JP | 2020/524417 A | 8/2020 |
| KR | 2015/0051147 A | 5/2015 |
| KR | 2020/0010402 A | 1/2020 |

OTHER PUBLICATIONS

Office Action dated Oct. 19, 2022, issued in corresponding Korean Patent Application No. 10-2021-0064214.

* cited by examiner

HIGH ELECTRON MOBILITY TRANSISTOR

CROSS-REFERENCE TO RELATED APPLICATION

This application is based on and claims priority under 35 U.S.C. § 119 to Korean Patent Application No. 10-2021-0064214, filed on May 18, 2021 in the Korean Intellectual Property Office, the disclosure of which is incorporated by reference herein in its entirety.

BACKGROUND

1. Field

The present disclosure relates to a high electron mobility transistor.

2. Description of the Related Art

Various power conversion systems may require a power device that controls the flow of current through on/off switching. In power conversion systems, the efficiency of a power device may influence the efficiency of the entire system.

It may be difficult to increase the efficiency of silicon (Si)-based power devices due to limitations in physical properties of silicon and/or limitations in manufacturing processes. In order to overcome these limitations, research and development is being conducted to increase conversion efficiency by applying a Group III-V-based compound semiconductor, such as gallium nitride (GaN), to power devices. Recently, a high electron mobility transistor (HEMT) using a heterojunction structure of a compound semiconductor has been studied.

SUMMARY

Provided are high electron mobility transistors.

Additional aspects will be set forth in part in the description which follows and, in part, will be apparent from the description, or may be learned by practice of the presented embodiments of the disclosure.

According to an embodiment, a high electron mobility transistor (HEMT) including an active region, in which a channel is formed, and a field region surrounding the active region is provided. The HEMT includes a channel layer; a barrier layer on the channel layer and configured to induce two-dimensional electron gas (2DEG) in the channel layer; a source and a drain on the barrier layer in the active region; and a gate on the barrier layer, the gate protruding from the active region to the field region. The gate includes a first gate and a second gate. The first gate is in the active region. The second gate is in a boundary region of the HEMT between the active region and the field region. A work function of the second gate is different from a work function of the first gate.

In some embodiments, a material of the second gate may have a work function that is lower than a work function of a material of the first gate.

In some embodiments, a material of the first gate and a material of the second gate may have a work function of about 4.0 eV to about 6.0 eV.

In some embodiments, the first gate and the second gate may include a material forming a Schottky barrier with an underlying layer.

In some embodiments, the first gate and the second gate independently may include at least one of titanium nitride (TiN), nickel (Ni), tungsten (W), molybdenum (Mo), palladium (Pd), or platinum (Pt).

In some embodiments, the channel layer may include a gallium nitride (GaN)-based material, and the barrier layer may include a nitride including at least one of aluminum (Al), gallium (Ga), indium (In), and boron (B).

In some embodiments, the HEMT may further include a depletion forming layer between the channel layer and the gate. The depletion forming layer may be configured to form a depletion region in the 2DEG.

In some embodiments, the depletion forming layer may include a p-type Group III-V-based nitride semiconductor.

In some embodiments, the gate may be between the source and the drain. The gate may be parallel to the source and the drain.

In some embodiments, the gate may surround the source.

In some embodiments, the first gate may cover the second gate. Alternatively, in some embodiments, the first gate may not cover the second gate.

According to another embodiment, a high electron mobility transistor (HEMT) including an active region, in which a channel is formed, and a field region surrounding the active region is provided. The HEMT includes a channel layer; a barrier layer on the channel layer and configured to induce two-dimensional electron gas (2DEG) in the channel layer; a source and a drain on the barrier layer in the active region; a gate on the barrier layer, the gate protruding from the active region to the field region; and a depletion forming layer between the channel layer and the gate, the depletion forming layer being configured to form a depletion region in the 2DEG. A thickness of the depletion forming layer in the active region may be different from a thickness of the depletion forming layer in a boundary region of the HEMT between the active region and the field region.

In some embodiments, a thickness of the depletion forming layer in the active region may be less than a thickness of the depletion forming layer in the boundary region between the active region and the field region.

In some embodiments, the channel layer may include a gallium nitride (GaN)-based material, and the barrier layer may include a nitride including at least one of aluminum (Al), gallium (Ga), indium (In), and boron (B).

In some embodiments, the depletion forming layer may include a p-type Group III-V-based nitride semiconductor.

In some embodiments, the gate may include a first gate and a second gate. The first gate may be in the active region. The second gate may be in the boundary region between the active region and the field region. A work function of the first gate may be different from a work function of the second gate.

In some embodiments, the second gate may include a material having a work function lower than that of the first gate.

In some embodiments, the gate and the depletion forming layer may be between the source and the drain. The gate and the depletion forming layer may be parallel to the source and the drain.

In some embodiments, the gate and the depletion forming layer may surround the source.

According to another embodiment, a high electron mobility transistor (HEMT) including an active region, in which a channel is formed, and a field region surrounding the active region is provided. The HEMT includes a channel layer; a barrier layer on the channel layer and configured to induce a two-dimensional electron gas (2DEG) in the channel layer; a source and a drain on the barrier layer in the active region; and a gate electrode on the barrier layer. The gate electrode extends over the active region to the field region. The gate electrode includes a first portion over the active region and a second portion extending over a boundary region of the HEMT between the active region and the field region. The first portion of the gate electrode and the second portion of the gate electrode have at least one of different work functions from each other and different vertical distances to an upper surface of the barrier layer from each other.

In some embodiments, the HEMT may further include a depletion forming layer on the barrier layer between the gate and the barrier. The depletion forming layer may be configured to form a depletion region in the 2DEG.

In some embodiments, a thickness of the depletion forming layer in the active region may be different from a thickness of the depletion forming layer in a boundary region of the HEMT between the active region and the field region.

In some embodiments, the gate may include a first gate and a second gate. The first portion of the gate may be the first gate. The second portion of the gate may be the second gate. The first gate and the second gate may have different work functions from each other.

In some embodiments, the gate may surround the source.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
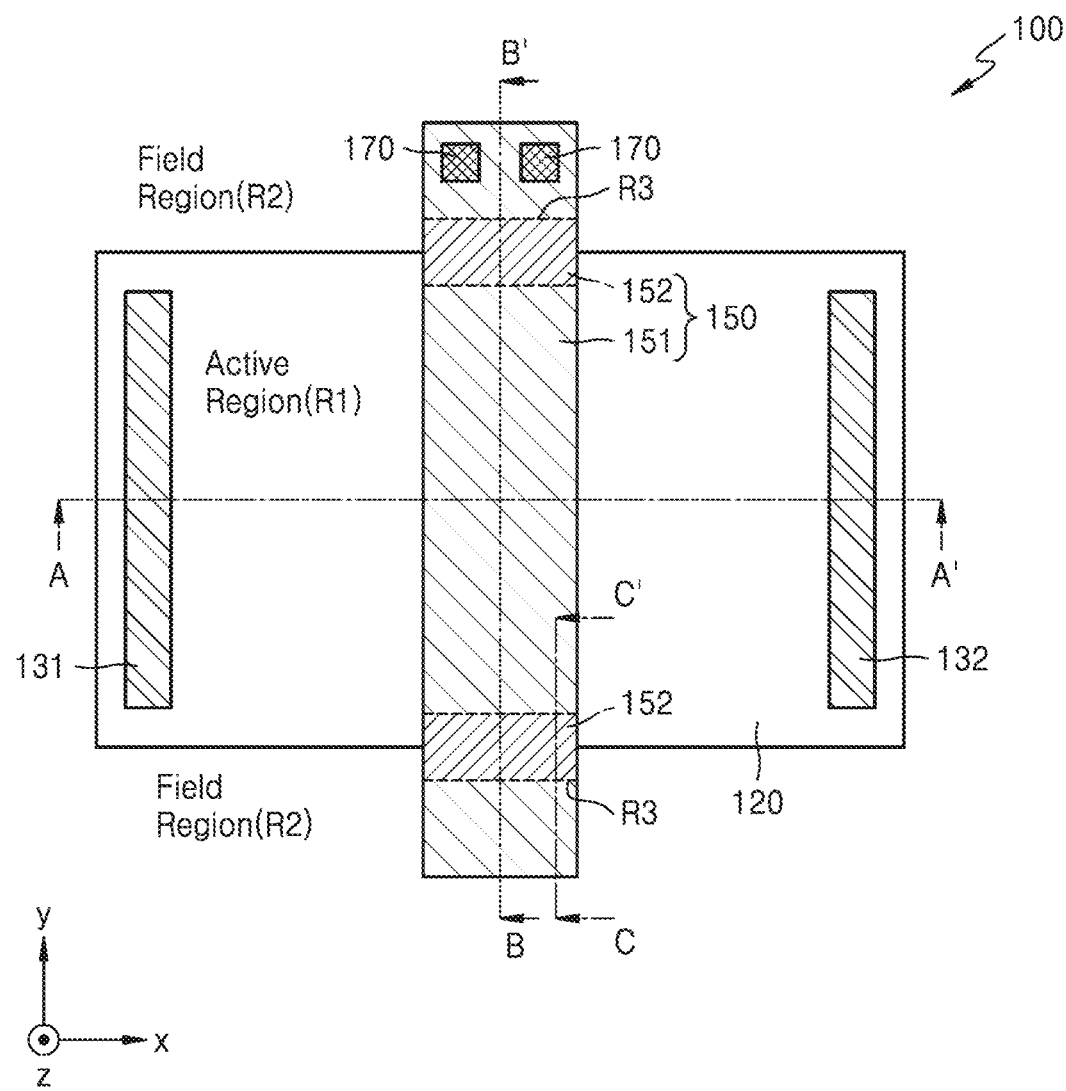
FIG. 1 is a plan view of a high electron mobility transistor (HEMT) according to an example embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, "at least one of A, B, and C," "at least one of A, B, or C," "one of A, B, C, or a combination thereof," and "one of A, B, C, and a combination thereof," respectively, may be construed as covering any one of the following combinations: A; B; A and B; A and C; B and C; and A, B, and C."

Hereinafter, example embodiments of the present disclosure will be described in detail with reference to the accompanying drawings. In the following drawings, the same reference numerals denote the same elements, and the size of each element in the drawings may be exaggerated for clarity and convenience of explanation. On the other hand, the following embodiments are merely examples, and various modifications may be made from these embodiments.

Hereinafter, the terms "above" or "on" may include not only those that are directly above, below, left, and right in a contact manner, but also those that are above, below, left, and right in a non-contact manner. In other words, a first element "above" or "on" second element may be directly on (or directly above) the second element, but the first element also may be on (or above) an intervening element between the first element and the second element. The singular forms "a," "an," and "the" as used herein are intended to include the plural forms as well unless the context clearly indicates otherwise. It will be understood that the terms "comprise," "include," or "have" as used herein specify the presence of stated elements, but do not preclude the presence or addition of one or more other elements.

The use of the term "the" and similar demonstratives may correspond to both the singular and the plural. Steps constituting methods may be performed in any suitable order unless otherwise indicated herein or otherwise clearly contradicted by context, and are not necessarily limited to the stated order.

Also, the terms such as "unit" and "module" described in the specification mean units that process at least one function or operation, and may be implemented as hardware, software, or a combination of hardware and software.

Connecting lines or connecting members illustrated in the drawings are intended to represent examples functional relationships and/or physical or logical connections between the various elements. It should be noted that many alternative or additional functional relationships, physical connections or logical connections may be present in a practical device.

The use of all illustrations or illustrative terms in the embodiments is simply to describe the embodiment in detail, and the scope of the present disclosure is not limited due to the illustrations or illustrative terms unless they are limited by claims.

A high electron mobility transistor (HEMT) includes semiconductor layers having different electrical polarization characteristics from each other. In the HEMT, a semiconductor layer having a relatively large polarizability may induce two-dimensional electron gas (2DEG) in another semiconductor layer bonded thereto. The 2DEG may have very high electron mobility.

On the other hand, when the HEMT becomes a normally-on state in which a current flows due to a low resistance between a drain electrode and a source electrode when a gate voltage is 0 V, current and power consumption may occur. In order to turn off the current between the drain electrode and the source electrode, a negative voltage has to be applied to a gate electrode. As a solution to solve these problems, a depletion forming layer is provided to implement normally-off characteristics in which a current between a drain electrode and a source electrode is turned off when a gate voltage is 0 V.

Figure 2:
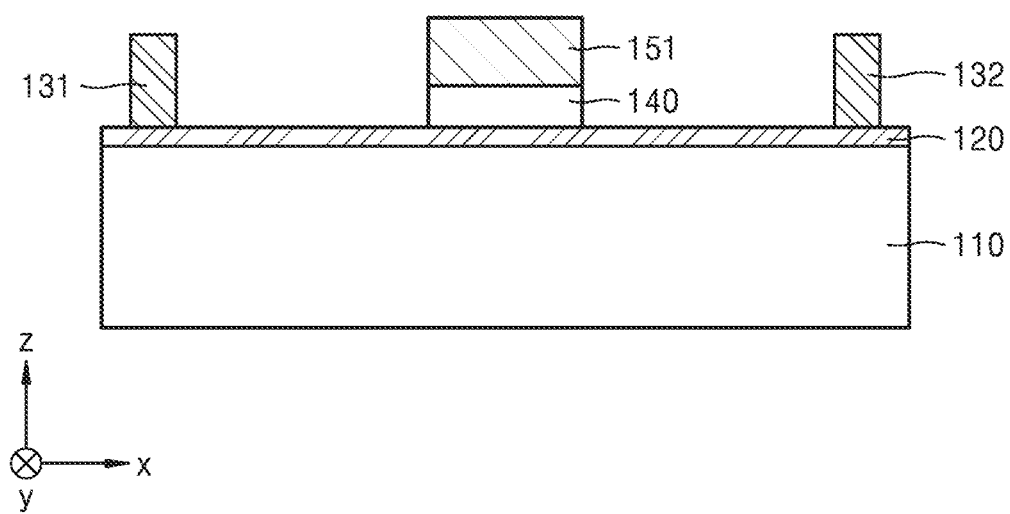
FIG. 2 is a cross-sectional view of the HEMT taken along line A-A' of FIG. 1.
Figure 3:
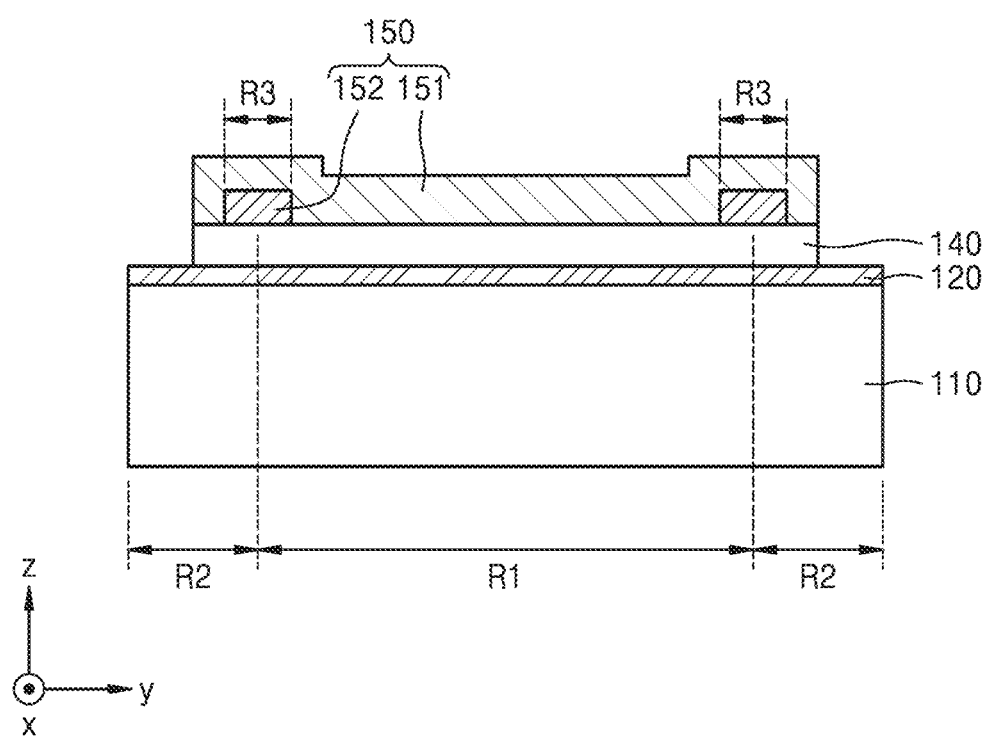
FIG. 3 is a cross-sectional view of the HEMT taken along line B-B' of FIG. 1.
Figure 4:
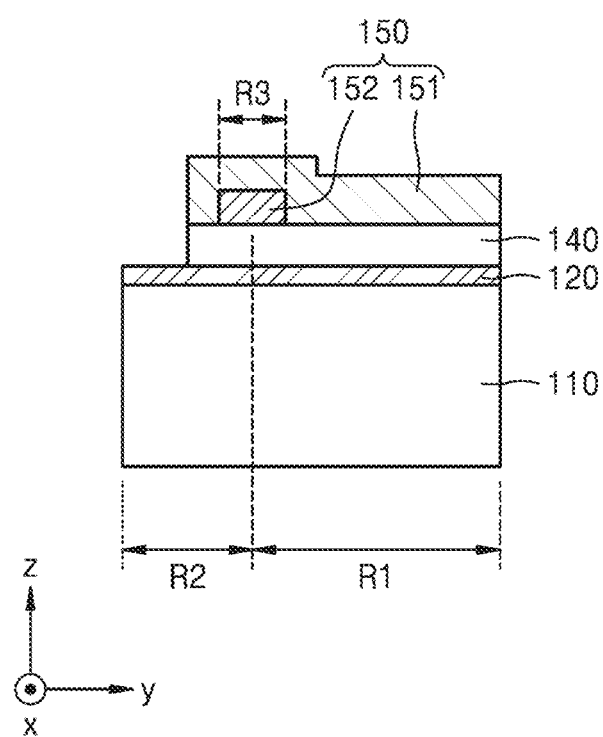
FIG. 4 is a cross-sectional view of the HEMT taken along line C-C' of FIG. 1.

FIG. 1 is a plan view of an HEMT 100 according to an example embodiment. FIG. 2 is a cross-sectional view of the HEMT 100 taken along line A-A' of FIG. 1, and FIG. 3 is a cross-sectional view of the HEMT 100 taken along line B-B' of FIG. 1. FIG. 4 is a cross-sectional view of the HEMT 100 taken along line C-C' of FIG. 1.

Referring to FIGS. 1 to 4, the HEMT 100 includes an active region R1 in which a channel is formed, and a field region R2 provided as an inactive region to surround the active region R1.

The HEMT 100 includes a channel layer 110, a barrier layer 120 provided on the channel layer 110, a source 131 and a drain 132 provided on the barrier layer 120, a depletion forming layer 140 provided on the barrier layer 120 between the source 131 and the drain 132, and a gate 150 provided on the depletion forming layer 140.

The channel layer 110 may be provided on a substrate (not illustrated). The substrate may include, for example, sapphire, Si, SiC, or GaN, but the present disclosure is not limited thereto, and the substrate may include various other materials.

The channel layer 110 may include a Group III-V-based compound semiconductor material. For example, the channel layer 110 may include a GaN-based material layer. As a specific example, the channel layer 110 may include a GaN layer. In this case, the channel layer 110 may include an undoped GaN layer. In some cases, the channel layer 110 may include a GaN layer doped with certain impurities.

A buffer layer (not illustrated) may be further provided between the channel layer 110 and the substrate. The buffer layer alleviates a difference in lattice constant and thermal expansion coefficient between the substrate and the channel layer 110. The buffer layer may include a nitride including at least one of aluminum (Al), gallium (Ga), indium (In), and boron (B), and may have a single-layer structure or a multilayer structure. For example, the buffer layer may include at least one of AlN, GaN, AlGaN, InGaN, AlInN, and AlGaInN. A seed layer (not illustrated) for the growth of the buffer layer may be further provided between the substrate and the buffer layer.

A barrier layer 120 may be provided on the channel layer 110. The barrier layer 120 may induce 2DEG in the channel layer 110. 2DEG may be formed in the channel layer 110 under an interface between the channel layer 110 and the barrier layer 120. The barrier layer 120 may include a semiconductor material different from that of the channel layer 110.

The barrier layer 120 may include, for example, a nitride including at least one of Al, Ga, In, and B. As a specific example, the barrier layer 120 may include at least one of AlGaN, AlInN, InGaN, AlN, and AlInGaN. However, the present disclosure is not limited thereto. The barrier layer 120 may include an undoped layer, but may also include a layer doped with certain impurities.

In the barrier layer 120, the source 131 and the drain 132 are apart from each other. The source 131 and the drain 132 are provided in the active region R1 of the barrier layer 120. The source 131 and the drain 132 may be provided in parallel with each other in the y-axis direction. The source 131 and the drain 132 may include, for example, a conductive material such as Ti or Al. On the other hand, the source 131 and the drain 132 may be provided in contact with the channel layer 110.

The depletion forming layer 140 is provided on the barrier layer 120 between the source 131 and the drain 132. The depletion forming layer 140 may be provided in parallel with the source 131 and the drain 132 in the y-axis direction. The depletion forming layer 140 may be provided to protrude from the active region R1 to the field region R2.

The depletion forming layer 140 may include a p-type semiconductor material. The depletion forming layer 140 may include a Group III-V-based nitride semiconductor. The depletion forming layer 140 may include, for example, a material in which at least one of GaN, AlGaN, InN, AlInN, InGaN, and AlInGaN is doped with a p-type impurity. As a specific example, the depletion forming layer 140 may include a p-GaN layer.

Because the depletion forming layer 140 may increase an energy bandgap of a portion of the barrier layer 120 positioned thereunder, a depletion region of 2DEG may be formed in a portion of the channel layer 110 corresponding to the depletion forming layer 140. Therefore, a portion of 2DEG corresponding to the depletion forming layer 140 may be broken, or may have characteristics (e.g., electron concentration, etc.) different from those of the remaining portion. A region in which 2DEG is broken may be referred to as a "disconnection region." Due to the disconnection region, the power device may have normally-off characteristics in which a current between the drain 132 and the source 131 is turned off when a gate voltage is 0 V.

A gate 150 is provided on the depletion forming layer 140. The gate 150 may be provided in the y-axis direction in parallel with the source 131 and the drain 132. The gate 150 may be provided to protrude from the active region R1 to the field region R2. A gate contact 170 may be provided at an end portion of the gate 150.

The gate 150 may include a first gate 151 and a second gate 152. The first gate 151 may be provided in the active region R1, and the second gate 152 may be provided in a boundary region R3 between the active region R1 and the field region R2. On the other hand, the first gate 151 may be provided in the field region R2. However, the present disclosure is not limited thereto, and the second gate 152 may be provided in the field region R2.

The first and second gates 151 and 152 may be provided to form a Schottky barrier with the depletion forming layer 140 thereunder. Specifically, the first gate 151 may form a Schottky barrier with the depletion forming layer 140 in the active region R1, and the second gate 152 may form a Schottky barrier with the depletion forming layer 140 in the boundary region R3 between the active region R1 and the field region R2. As illustrated in FIG. 3, the first gate 151 may be provided so as to cover the second gate 152. However, the present disclosure is not limited thereto. As will be described later, the first gate 151 may be provided so as not to cover the second gate 152.

The first and second gates 151 and 152 may include materials having different work functions from each other. Specifically, the second gate 152 may include a material having a work function lower than that of the first gate 151. The first and second gates 151 and 152 may include different types of materials having different work functions from each other. However, the present disclosure is not limited thereto, and the first and second gates 151 and 152 may include the same type of material having different work functions from each other. The first and second gates 151 and 152 may include, for example, a material having a work function of about 4.0 eV to about 6.0 eV. For example, the first and second gates 151 and 152 may include titanium nitride (TiN), nickel (Ni), tungsten (W), molybdenum (Mo), palladium (Pd), or platinum (Pt). However, the present disclosure is not limited thereto.

In the present embodiment, because the gate 150 includes the first and second gates 151 and 152 including materials having different work functions from each other, as will be described later, a threshold voltage of an edge transistor formed in the boundary region R3 between the active region R1 and the field region R2 may be increased, and thus, a current-voltage characteristic curve without a hump may be obtained.

Figure 5:
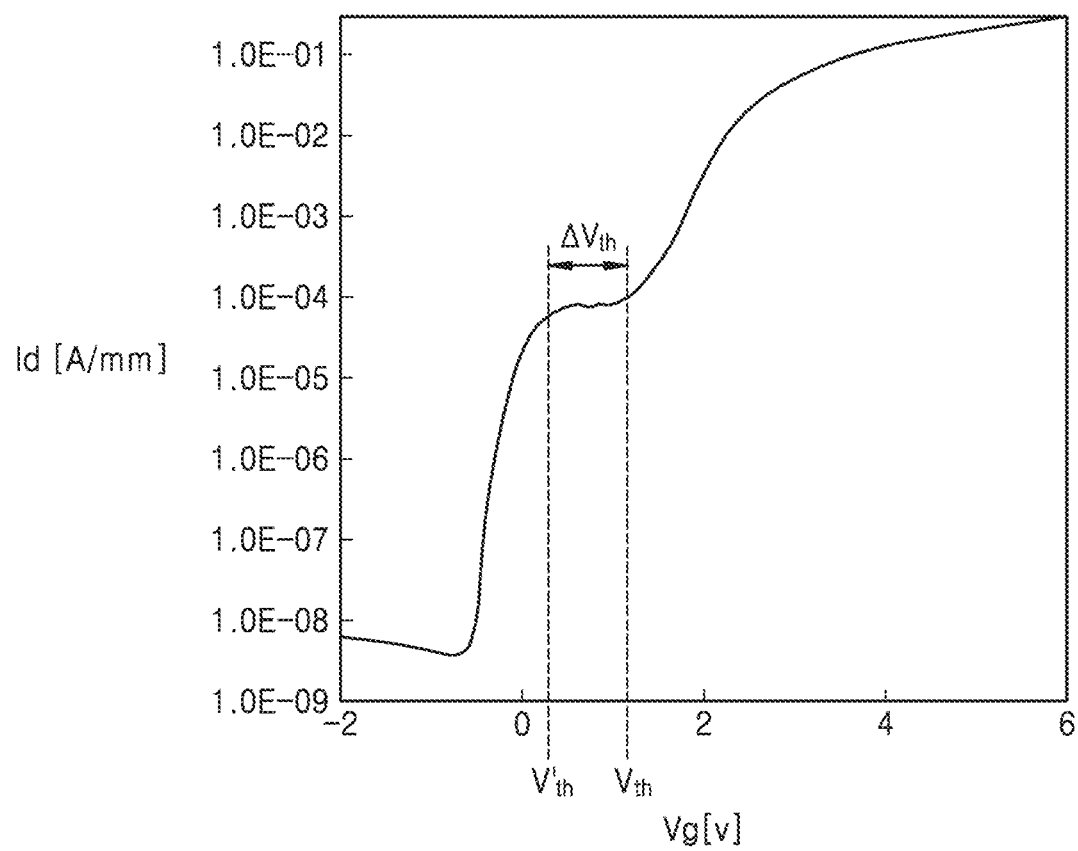
FIG. 5 illustrates a current ($I_d$)-voltage ($V_g$) characteristic curve of an HEMT including one gate material having a specific work function.

FIG. 5 illustrates a current ($I_d$)-voltage ($V_g$) characteristic curve of an HEMT including one gate material having a specific work function. In FIG. 5, a GaN layer was used as a channel layer, an AlGaN layer was used as a barrier layer, and a p-GaN layer was used as a depletion forming layer.

In a general HEMT, when a voltage is applied to a gate, a gate electric field may be less distributed in the active region R1 (specifically, the active region R1 between the boundary regions R3) than in the boundary region R3 between the active region R1 and the field region R2. Due to the non-uniform distribution of the gate electric field, a hump may occur in the current ($I_d$)-voltage ($V_g$) characteristic curve of the HEMT.

As the gate electric field is more distributed in the boundary region R3 between the active region R1 and the field region R2 than in the active region R1, the current ($I_d$) may start to flow in the boundary region R3 even when the current ($I_d$) does not flow in the active region R1. That is, when the voltage applied to the gate is increased, a channel through which the current ($I_d$) flows may be formed earlier in the boundary region R3 than in the active region R1. Therefore, an edge transistor formed in the boundary region R3 may have a first threshold voltage ($V'_{th}$), and a main transistor formed in the active region R1 may have a second threshold voltage ($V_{th}$) greater than the first threshold voltage ($V'_{th}$). In FIG. 5, a difference ($\Delta V_{th}$) between the first threshold voltage ($V'_{th}$) and the second threshold voltage ($V_{th}$) was measured to be about 1.2 V. As such, when the HEMT has the first threshold voltage ($V'_{th}$) and the second threshold voltage ($V_{th}$) different from each other, it is difficult to design the operation characteristics of the HEMT as desired, and thus, it may be difficult to apply the HEMT to a power device.

Figure 6A:
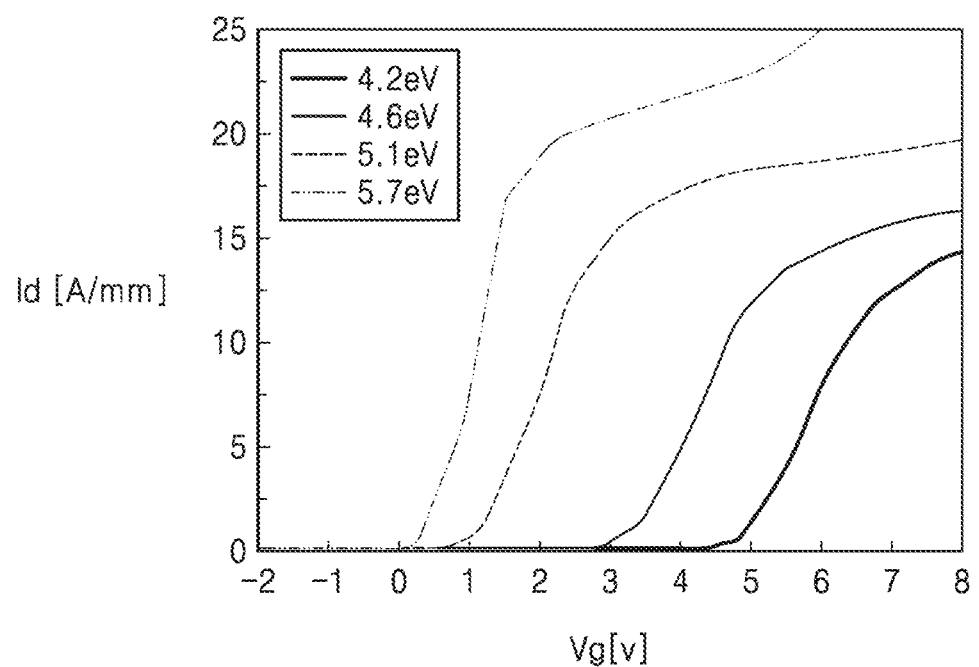
FIG. 6A illustrates a current ($I_d$)-voltage ($V_g$) characteristic curve of an HEMT according to a work function of a gate material.
Figure 6B:
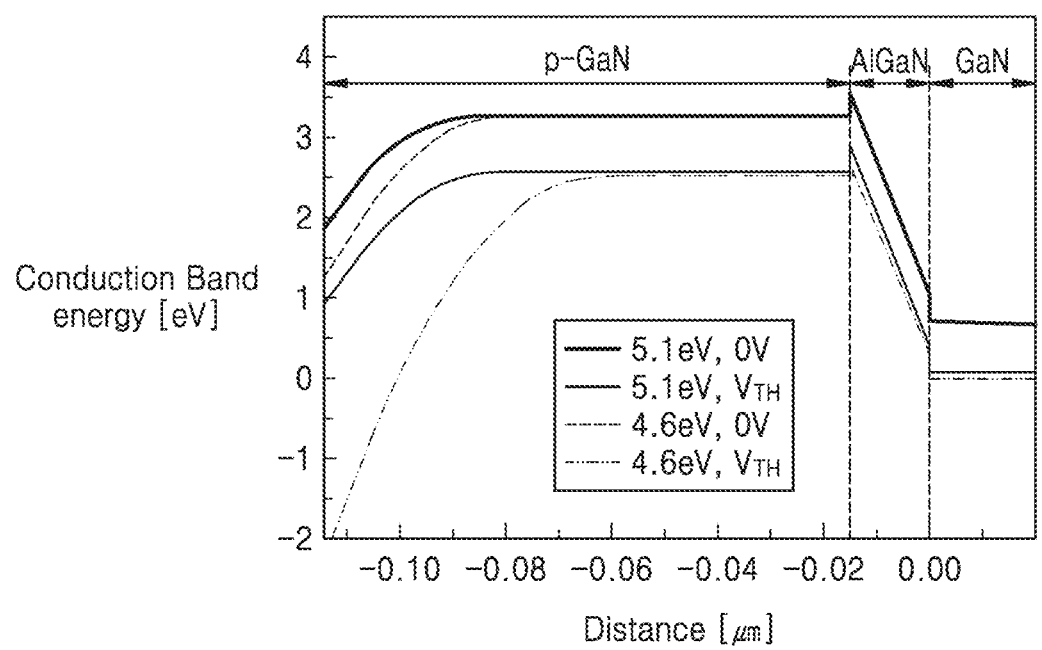
FIG. 6B illustrates an energy diagram of an HEMT according to a work function of a gate material.

FIG. 6A illustrates a current ($I_d$)-voltage ($V_g$) characteristic curve of an HEMT according to a work function of a gate material. FIG. 6B illustrates an energy diagram of an HEMT according to a work function of a gate material. In FIGS. 6A and 6B, a GaN layer was used as a channel layer, an AlGaN layer was used as a barrier layer, and a p-GaN layer was used as a depletion forming layer.

Referring to FIGS. 6A and 6B, it may be seen that the threshold voltage increases as the work function of the gate material decreases, and the threshold voltage decreases as the work function of the gate material increases. As such, the threshold voltage may be adjusted by changing the work function of the gate material.

In the HEMT 100 according to the present embodiment, the first gate 151 is provided in the active region R1, and the second gate 152 having a work function different from that of the first gate 151 is provided in the boundary region R3 between the active region R1 and the field region R2. The second gate 152 may include a material having a work function lower than that of the first gate 151. In this case, because the threshold voltage of the edge transistor formed in the boundary region R3 between the active region R1 and the field region R2 may be increased, a current-voltage characteristic curve, from which a hump is removed, may be obtained.

For example, in FIG. 5 as described above, the difference ($\Delta V_{th}$) between the first threshold voltage ($V'_{th}$) of the edge transistor formed in the boundary region R3 between the active region R1 and the field region R2 and the second threshold voltage ($V_{th}$) of the main transistor formed in the active region R1 was measured to be about 1.2 V. When comparing the difference (ONO between the first threshold voltage ($V'_{th}$) and the second threshold voltage ($V_{th}$) with data shown in FIG. 6A, it may be seen that the difference ($\Delta V_{th}$) of about 1.2 V corresponds to the work function difference of about 0.4 eV. Therefore, the second gate 152 provided in the boundary region R3 between the active region R1 and the field region R2 is made of a material having a work function lower than that of the first gate 151 provided in the active region R1 by about 0.4 eV, a current-voltage characteristic curve without a hump may be obtained.

As described above, in the HEMT 100 according to the example embodiment, the effect of the edge transistor formed in the boundary region R3 between the active region R1 and the field region R2 may be limited and/or suppressed by providing the first gate 151 in the active region R1 and providing the second gate 151 having a work function different from that of the first gate 151 in the boundary region R3 between the active region R1 and the field region R2. Therefore, a current-voltage characteristic curve without a hump may be obtained. As a result, the HEMT 100 having desired operating characteristics may be implemented.

Figure 7:
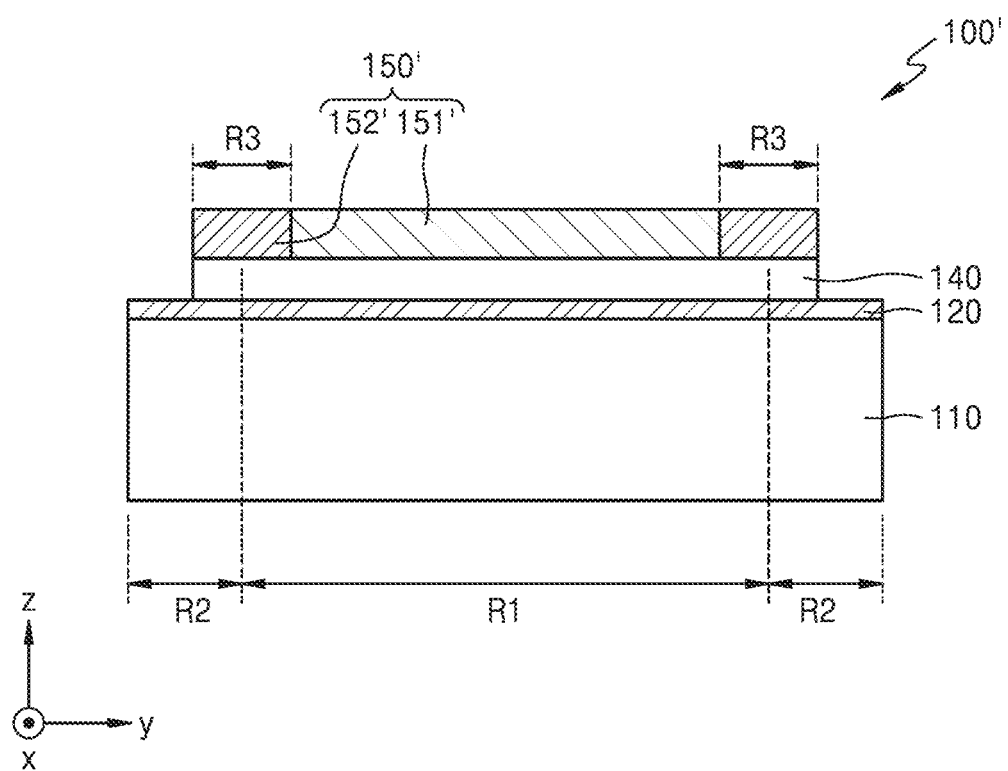
FIG. 7 is a cross-sectional view of an HEMT according to another example embodiment.

FIG. 7 is a cross-sectional view of an HEMT 100' according to another example embodiment. Referring to FIG. 7, a gate 150' includes a first gate 151' provided in an active region R1 and a second gate 152' provided in a boundary region R3 between the active region R1 and a field region R2. Unlike the above-described embodiment, the first gate 151' may be provided so as not to cover the second gate 152'.

Figure 8:
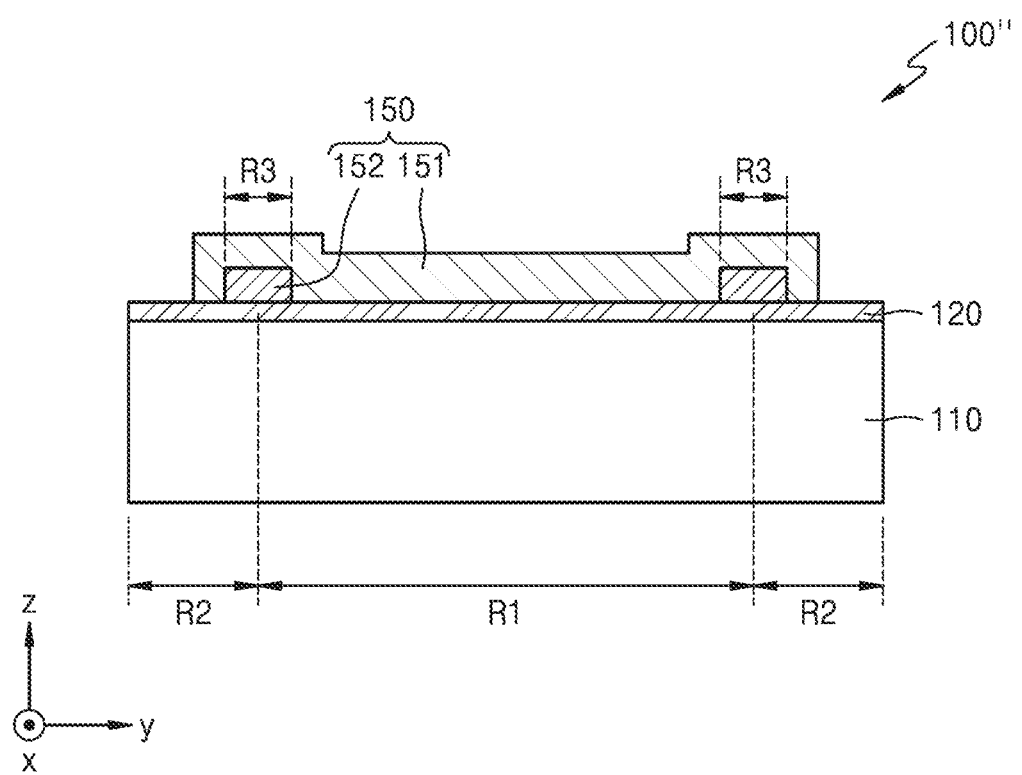
FIG. 8 is a cross-sectional view of an HEMT according to another example embodiment.

FIG. 8 is a cross-sectional view of an HEMT 100" according to another example embodiment. Referring to FIG. 8, the above-described depletion forming layer (140 in FIG. 2) is not provided on a barrier layer 120, and a gate 150 may be directly provided on the barrier layer 120. The gate 151 includes a first gate 151 provided in an active region R1 and a second gate 152 provided in a boundary region R3 between the active region R1 and a field region R2. The first and second gates 151 and 152 may include a material forming a Schottky barrier with the barrier layer 120 thereunder.

Figure 9:
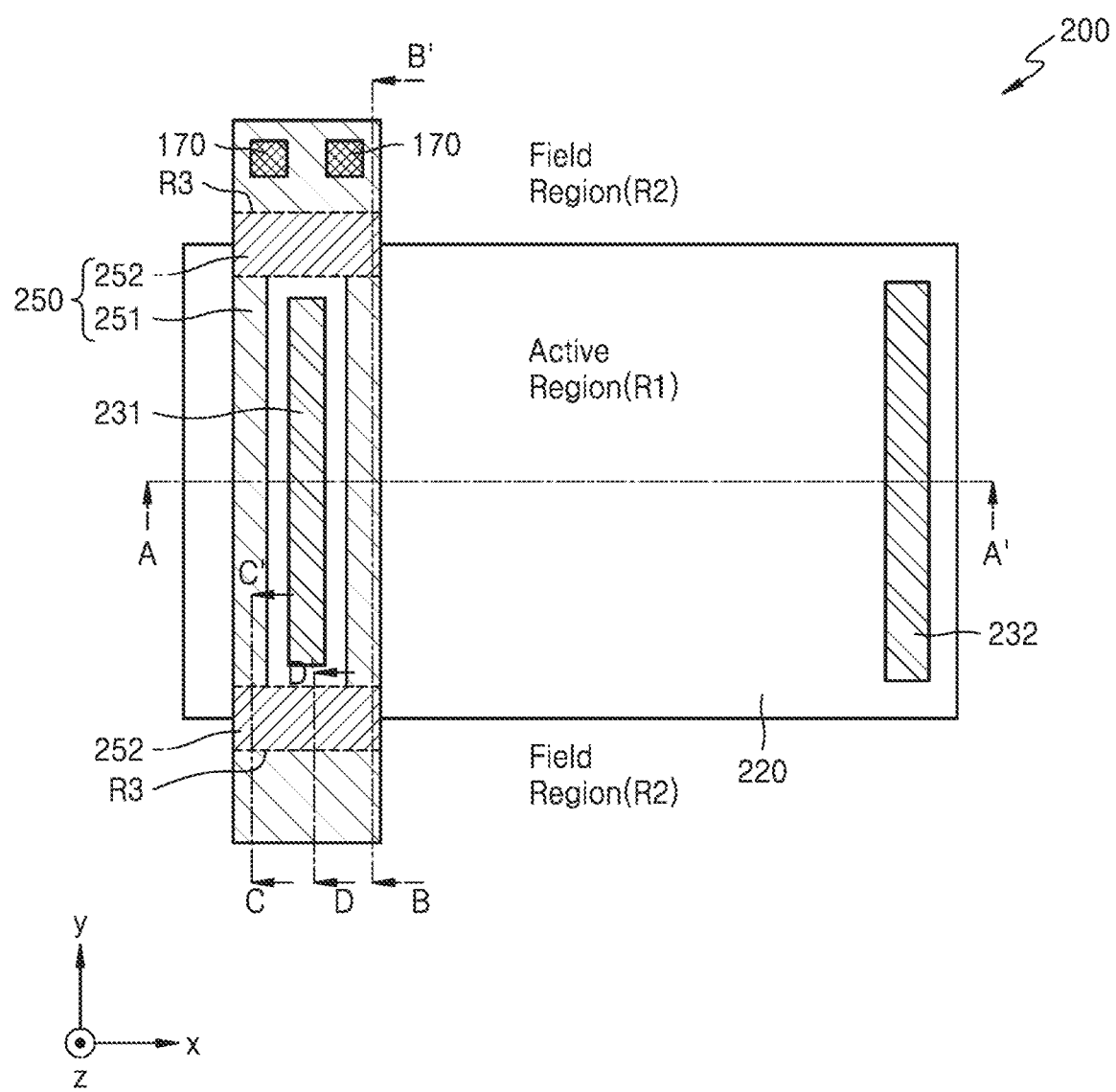
FIG. 9 is a plan view of an HEMT according to another example embodiment.
Figure 10:
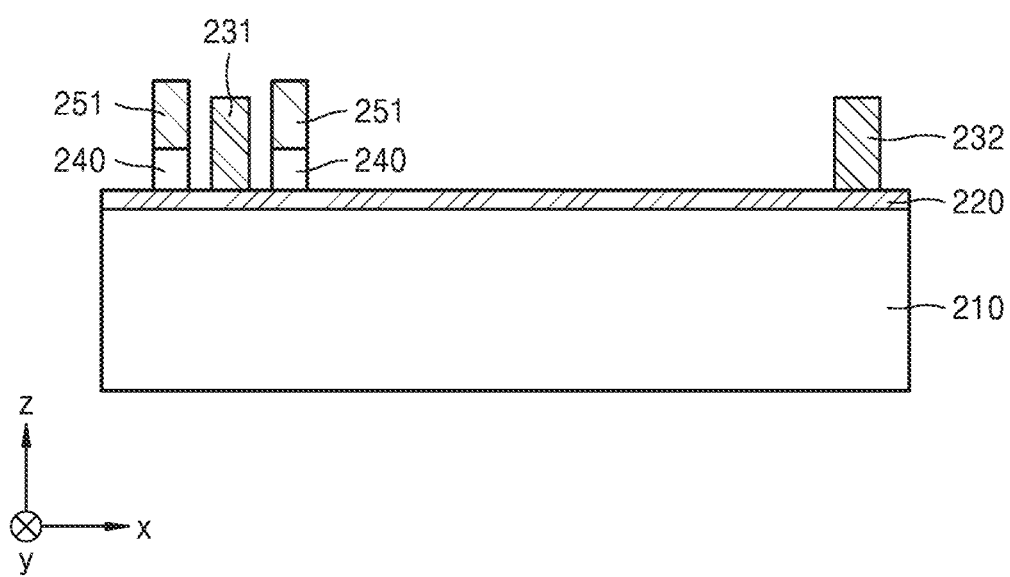
FIG. 10 is a cross-sectional view of the HEMT taken along line A-A' of FIG. 9.
Figure 11:
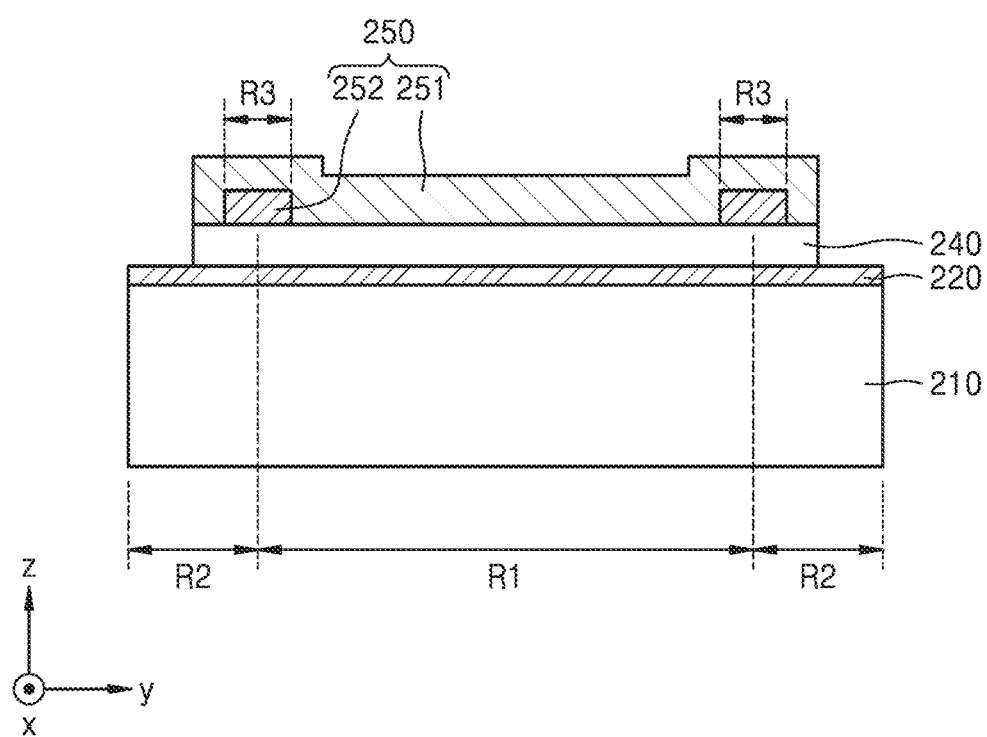
FIG. 11 is a cross-sectional view of the HEMT taken along line B-B' of FIG. 9.
Figure 12:
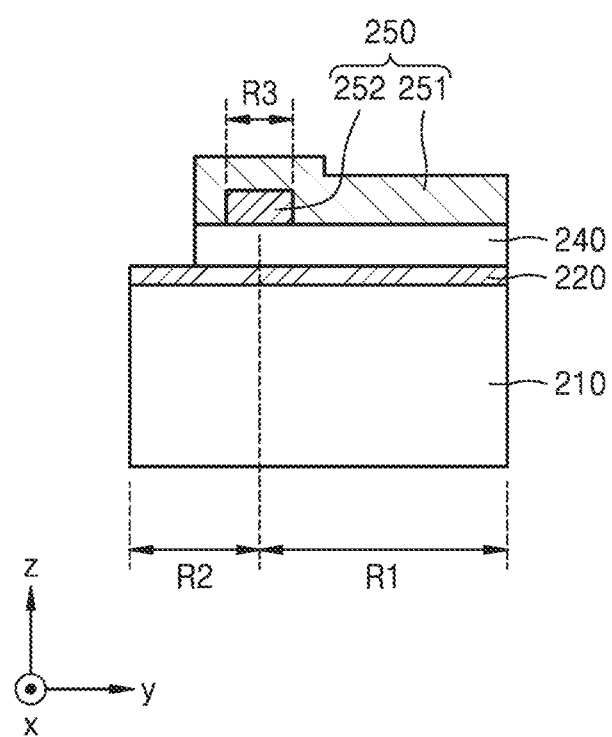
FIG. 12 is a cross-sectional view of the HEMT taken along line C-C' of FIG. 9.
Figure 13:
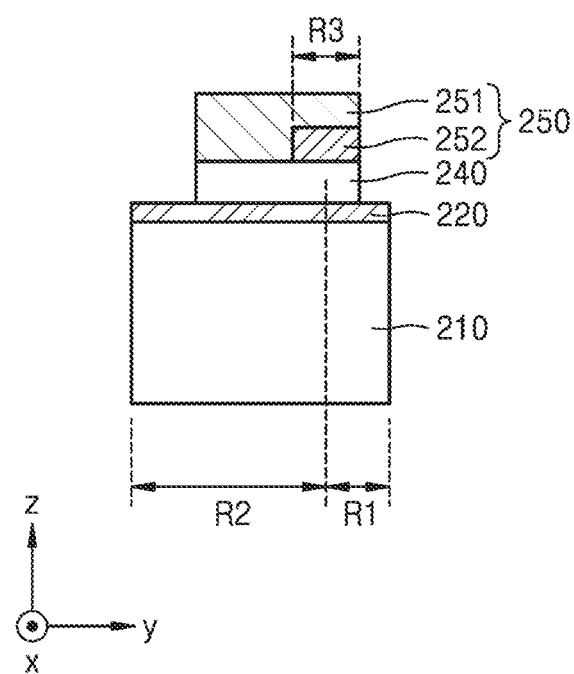
FIG. 13 is a cross-sectional view of the HEMT taken along line D-D' of FIG. 9.

FIG. 9 is a plan view of an HEMT 200 according to another example embodiment. FIG. 10 is a cross-sectional view of the HEMT 200 taken along line A-A' of FIG. 9, and FIG. 11 is a cross-sectional view of the HEMT 200 taken along line B-B' of FIG. 9. FIG. 12 is a cross-sectional view of the HEMT 200 taken along line C-C' of FIG. 9, and FIG. 13 is a cross-sectional view of the HEMT 200 taken along line D-D' of FIG. 9. Hereinafter, differences from the above-described embodiments will be mainly described.

Referring to FIGS. 9 to 13, the HEMT 200 includes a channel layer 210, a barrier layer 220 provided on the channel layer 210, a source 231 and a drain 232 provided on the barrier layer 220, a depletion forming layer 240 provided on the barrier layer 220, and a gate 250 provided on the depletion forming layer 240. Because the channel layer 210, the barrier layer 220, the source 231, and the drain 232 have been described above, descriptions thereof are omitted.

The depletion forming layer 240 is provided on the barrier layer 220, and the gate 250 is provided on the depletion forming layer 240. The depletion forming layer 240 and the gate 250 may be provided so as to surround the source 231. The depletion forming layer 240 and the gate 250 may be provided to protrude from an active region R1 to a field region R2.

The gate 250 may include a first gate 251 and a second gate 252. The first gate 251 may be provided in the active region R1, and the second gate 252 may be provided in a boundary region R3 between the active region R1 and the field region R2. The first and second gates 251 and 252 may be provided to form a Schottky barrier with the depletion forming layer 240 thereunder. The first gate 251 may be provided so as to cover the second gate 252. However, the present disclosure is not limited thereto. The first gate 251 alternatively may be provided so as not to cover the second gate 252.

The first and second gates 251 and 252 may include materials having different work functions from each other. Specifically, the second gate 252 may include a material having a work function lower than that of the first gate 251. The first and second gates 251 and 252 may include, for example, a material having a work function of about 4.0 eV to about 6.0 eV. For example, the first and second gates 251 and 252 may include TiN, Ni, W, Mo, Pd, or Pt. However, the present disclosure is not limited thereto.

In the HEMT 200 according to the present embodiment, the first gate 251 is provided in the active region R1, and the second gate 252 having a work function different from that of the first gate 252 is provided in the boundary region R3 between the active region R1 and the field region R2, thereby limiting and/or suppressing the effect of the edge transistor. Also, because the depletion forming layer 240 is provided so as to surround the source 231, the effect of the edge transistor formed in the boundary region between the active region R1 and the field region R2 may be limited and/or suppressed more effectively.

Figure 14:
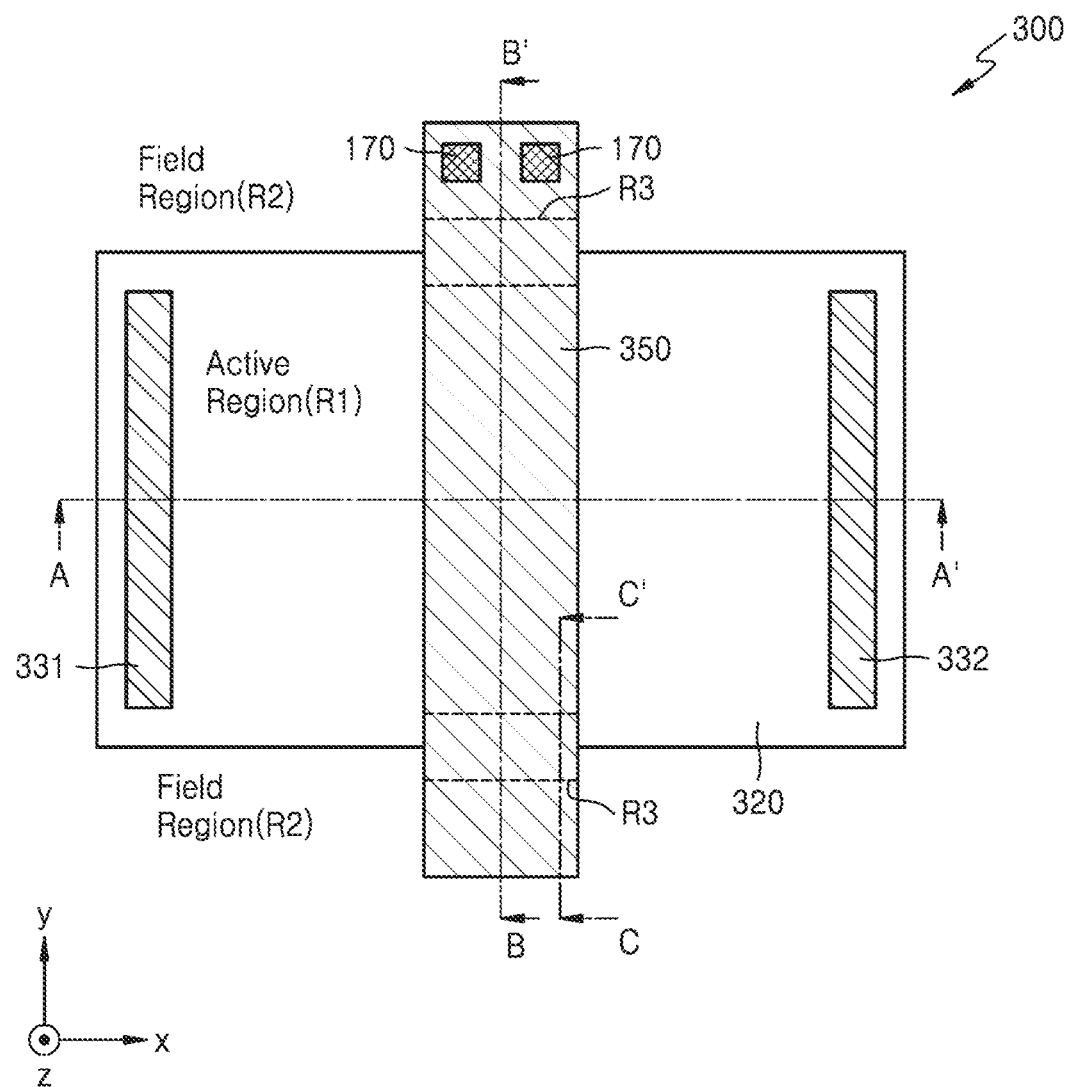
FIG. 14 is a plan view of an HEMT according to another example embodiment.
Figure 15:
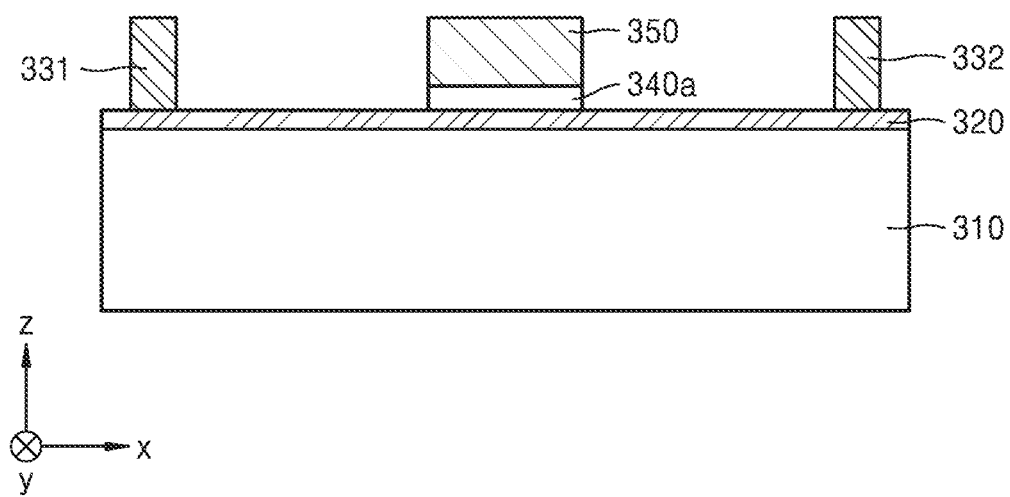
FIG. 15 is a cross-sectional view of the HEMT taken along line A-A' of FIG. 14.
Figure 16:
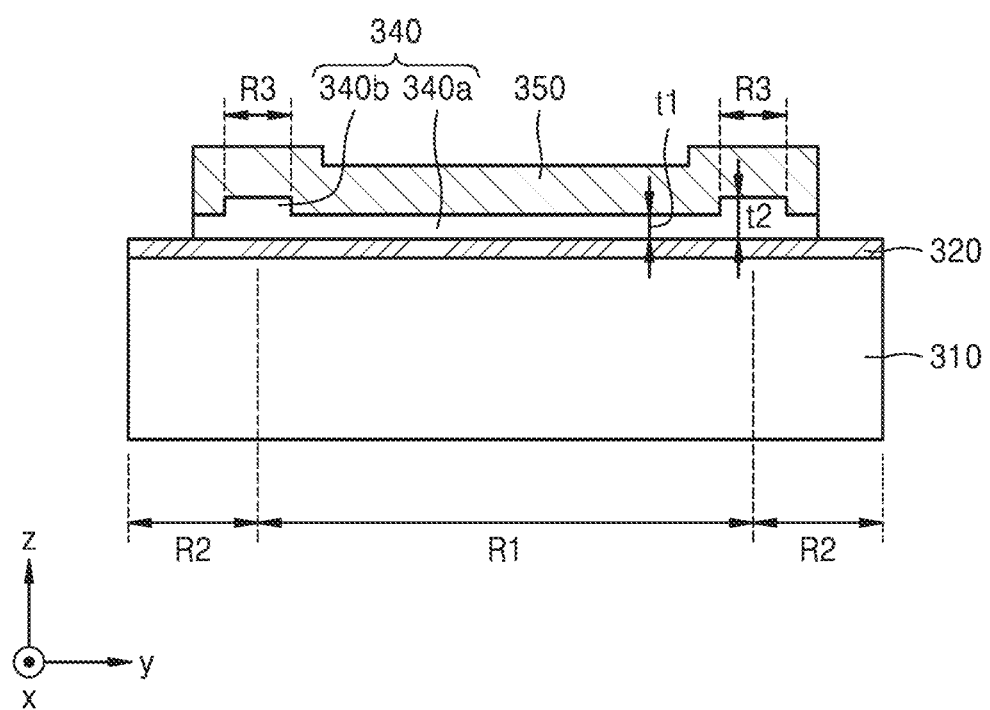
FIG. 16 is a cross-sectional view of the HEMT taken along line B-B' of FIG. 14.
Figure 17:
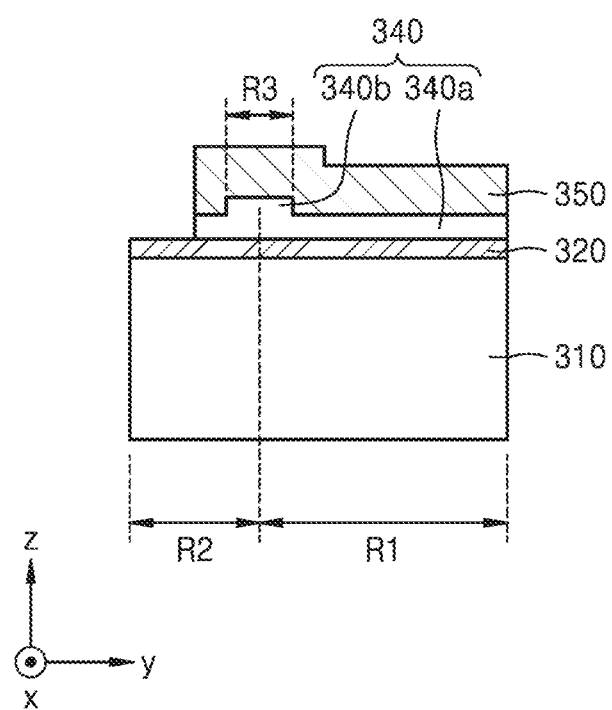
FIG. 17 is a cross-sectional view of the HEMT taken along line C-C' of FIG. 14.

FIG. 14 is a plan view of an HEMT 300 according to another example embodiment. FIG. 15 is a cross-sectional view of the HEMT 300 taken along line A-A' of FIG. 14, and FIG. 16 is a cross-sectional view of the HEMT 300 taken along line B-B' of FIG. 14. FIG. 17 is a cross-sectional view of the HEMT 300 taken along line C-C' of FIG. 14. Hereinafter, differences from the above-described embodiments will be mainly described.

Referring to FIGS. 14 to 17, the HEMT 300 includes a channel layer 310, a barrier layer 320 provided on the channel layer 310, a source 331 and a drain 332 provided on the barrier layer 320, a depletion forming layer 340 provided on the barrier layer 320 between the source 331 and the drain 332, and a gate 350 provided on the depletion forming layer 340. Because the channel layer 310, the barrier layer 320, the source 331, and the drain 332 have been described above, descriptions thereof are omitted.

The depletion forming layer 340 is provided on the barrier layer 320 between the source 331 and the drain 332. The depletion forming layer 340 may be provided in parallel with the source 331 and the drain 332 in the y-axis direction. The depletion forming layer 340 may include a p-type semiconductor material. For example, the depletion forming layer 340 may include a p-GaN layer.

The depletion forming layer 340 may be provided to protrude from an active region R1 to a field region R2. The depletion forming layer 340 may include a first depletion forming layer 340a provided in the active region R1 and a second depletion forming layer 340b provided in a boundary region R3 between the active region R1 and the field region R2. The first depletion forming layer 340a may have a thickness different from that of the second depletion forming layer 340b. Specifically, the first depletion forming layer 340a provided in the active region R1 may have a first thickness (t1), and the second depletion forming layer 340b provided in the boundary region R3 between the active region R1 and the field region R2 may have a second thickness (t2) greater than the first thickness (t1).

The depletion forming layer 340 may be formed by the following method. A material layer for forming depletion is formed on the barrier layer 320 to the second thickness (t2). The material layer formed in the active region R1 is etched to a certain depth to have the first thickness (t1). Therefore, the first depletion forming layer 340a having the first thickness (t1) may be formed in the active region R1, and the second depletion forming layer 340b having the second thickness (t2) may be formed in the boundary region R3 between the active region R1 and the field region R2.

A gate 350 is provided on the depletion forming layer 340. The gate 350 may be provided in the y-axis direction in parallel with the source 331 and the drain 332. Like the depletion forming layer 340, the gate 350 may be provided to protrude from the active region R1 to the field region R2. The gate 350 may include a material forming a Schottky barrier with the depletion forming layer 340 thereunder. For example, the gate 350 may include TiN, Ni, W, Mo, Pd, or Pt, but the present disclosure is not limited.

In the present embodiment, the first depletion forming layer 340a provided in the active region R1 is formed to be thinner than the second depletion forming layer 340b provided in the boundary region R3 between the active region R1 and the field region R2. Therefore, as will be described later, a threshold voltage of a main transistor formed in the active region R1 may be lowered, and a current-voltage characteristic curve without a hump may be obtained.

Figure 18A:
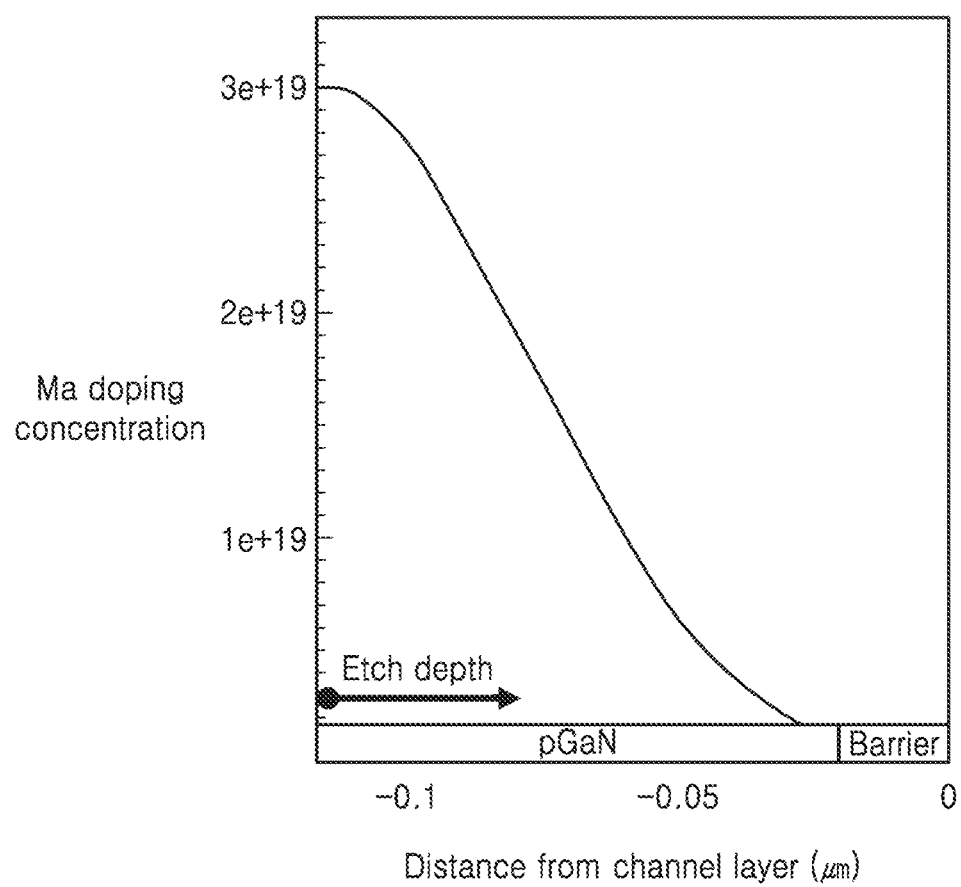
FIG. 18A illustrates a profile of a Mg doping concentration according to an etch depth of a depletion forming layer.
Figure 18B:
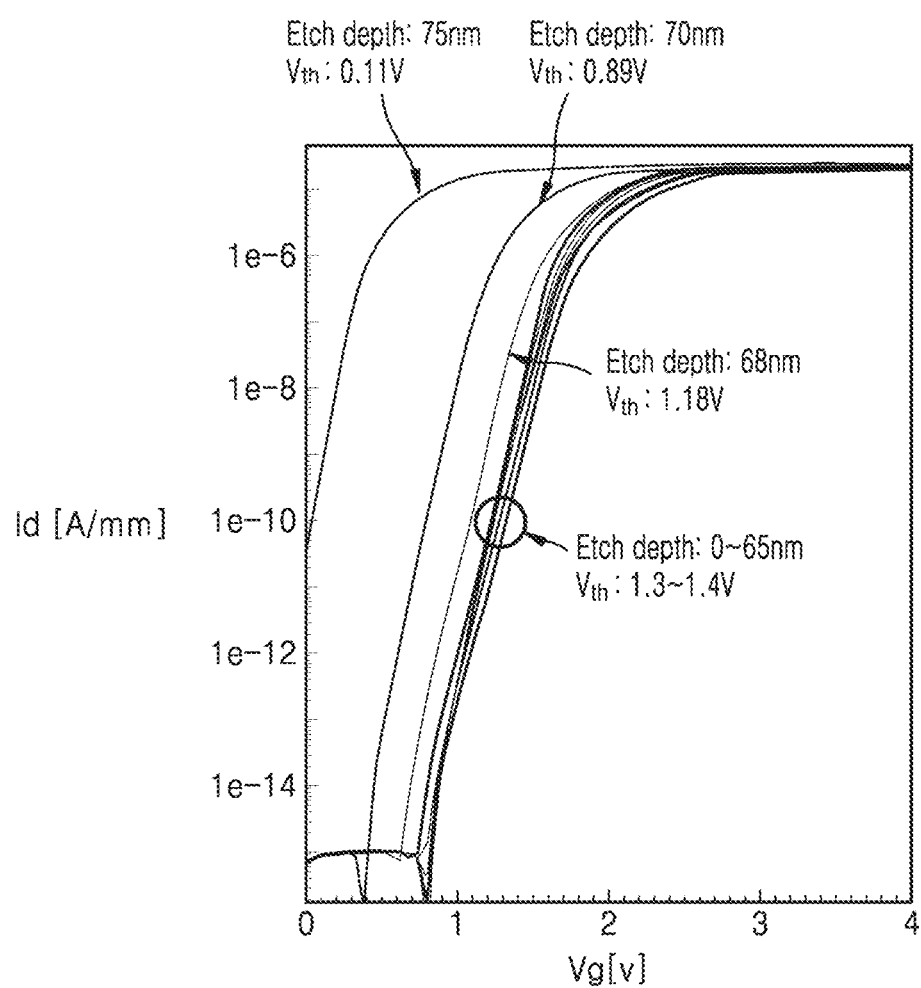
FIG. 18B illustrates a current ($I_d$)-voltage ($V_g$) characteristic curve of an HEMT according to an etch depth of a depletion forming layer.

FIG. 18A illustrates a profile of a Mg doping concentration according to an etch depth of a depletion forming layer. FIG. 18B illustrates a current ($I_d$)-voltage ($V^g$) characteristic curve of an HEMT according to an etch depth of a depletion forming layer. In FIGS. 18A and 18B, a GaN layer was used as a channel layer, and an AlGaN layer was used as a barrier layer. A p-GaN layer doped with Mg was used as the depletion forming layer.

Referring to FIG. 18A, as the etch depth of the p-GaN depletion forming layer increases, the Mg doping concentration decreases. From this, it may be seen that, as the etch depth of the p-GaN depletion forming layer increases and thus the thickness of the p-GaN depletion forming layer decreases, the Mg doping concentration decreases.

Referring to FIG. 18B, as the etch depth of the p-GaN depletion forming layer increases, the threshold voltage of the main transistor formed in the active region decreases. From this, it may be seen that, as the etch depth of the p-GaN depletion forming layer increases and thus the thickness of the p-GaN depletion forming layer decreases, the threshold voltage of the main transistor formed in the active region R1 decreases. As described above, the threshold voltage of the main transistor may be adjusted by changing the thickness of the p-GaN depletion forming layer formed in the active region R1.

In the HEMT 300 according to the present embodiment, the first depletion forming layer 340a provided in the active region R1 may be formed to be thinner than the second depletion forming layer 340b provided in the boundary region R3 between the active region R1 and the field region R2. Therefore, because the threshold voltage of the main transistor formed in the active region R1 may decrease, a current-voltage characteristic curve from which a hump is removed may be obtained.

For example, when comparing the threshold voltage difference ($\Delta V_{th}$) shown in FIG. 5 with data shown in FIG. 18B, the etch depth corresponding to the threshold voltage difference ($\Delta V_{th}$) (that is, the difference between the first thickness (t1) and the second thickness (t2)) may be known. When the first depletion forming layer 340a provided in the active region R1 is formed to the first thickness (t1) less than the second thickness (t2) based on the etch depth, a current-voltage characteristic curve from which a hump is removed may be obtained.

Figure 19:
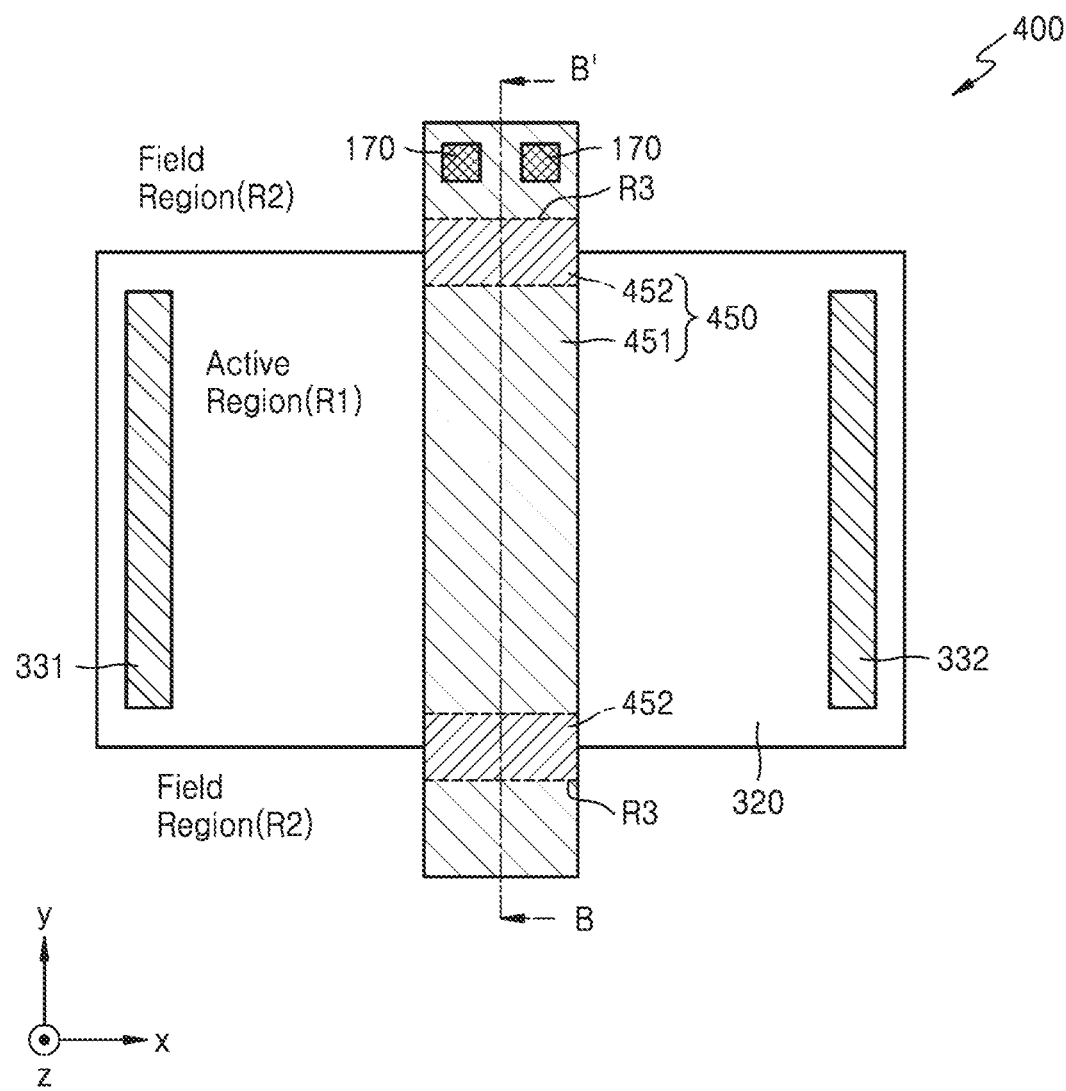
FIG. 19 is a plan view of an HEMT according to another example embodiment.
Figure 20:
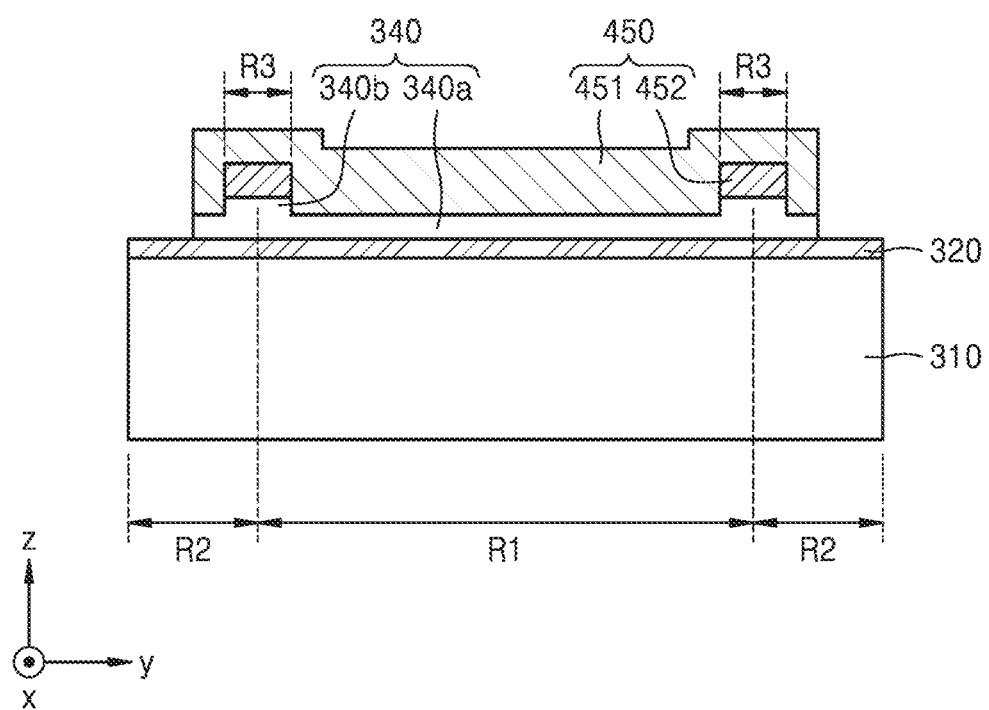
FIG. 20 is a cross-sectional view of the HEMT taken along line B-B' of FIG. 19.

FIG. 19 is a plan view of an HEMT 400 according to another example embodiment. FIG. 20 is a cross-sectional view of the HEMT 400 taken along line B-B' of FIG. 19. Hereinafter, differences from the above-described embodiments will be mainly described.

Referring to FIGS. 19 and 20, a depletion forming layer 340 may be provided to protrude from an active region R1 to a field region R2. The depletion forming layer 340 may include a first depletion forming layer 340a provided in the active region R1 and a second depletion forming layer 340b provided in a boundary region R3 between the active region R1 and the field region R2. As described above, the first depletion forming layer 340a provided in the active region R1 may have a thickness less than that of the second depletion forming layer 340b provided in the boundary region R3 between the active region R1 and the field region R2.

A gate 450 is provided on the depletion forming layer 340. The gate 450 may be provided to protrude from the active region R1 to the field region R2. The gate 450 may include a first gate 451 provided in the active region R1 and a second gate 452 provided in a boundary region R3 between the active region R1 and a field region R2.

The first and second gates 451 and 452 may be provided to form a Schottky barrier with the depletion forming layer 340 thereunder. As described above, the first and second gates 451 and 452 may include materials having different work functions from each other. Specifically, the second gate 452 may include a material having a work function lower than that of the first gate 451. The first and second gates 451 and 452 may include, for example, a material having a work function of about 4.0 eV to about 6.0 eV. For example, the first and second gates 451 and 452 may include TiN, Ni, W, Mo, Pd, or Pt. However, the present disclosure is not limited thereto.

In the HEMT 400 according to the present embodiment, because the first depletion forming layer 340a provided in the active region R1 may be formed to be thinner than the second depletion forming layer 340b provided in the boundary region R3 between the active region R1 and the field region R2, the threshold voltage of the main transistor formed in the active region R1 may decrease. Also, because the gate 450 includes the first and second gates 451 and 452 including materials having different work functions from each other, the threshold voltage of the edge transistor formed in the boundary region R3 between the active region R1 and the field region R2 may increase. Therefore, a current-voltage characteristic curve without a hump may be obtained.

Figure 21:
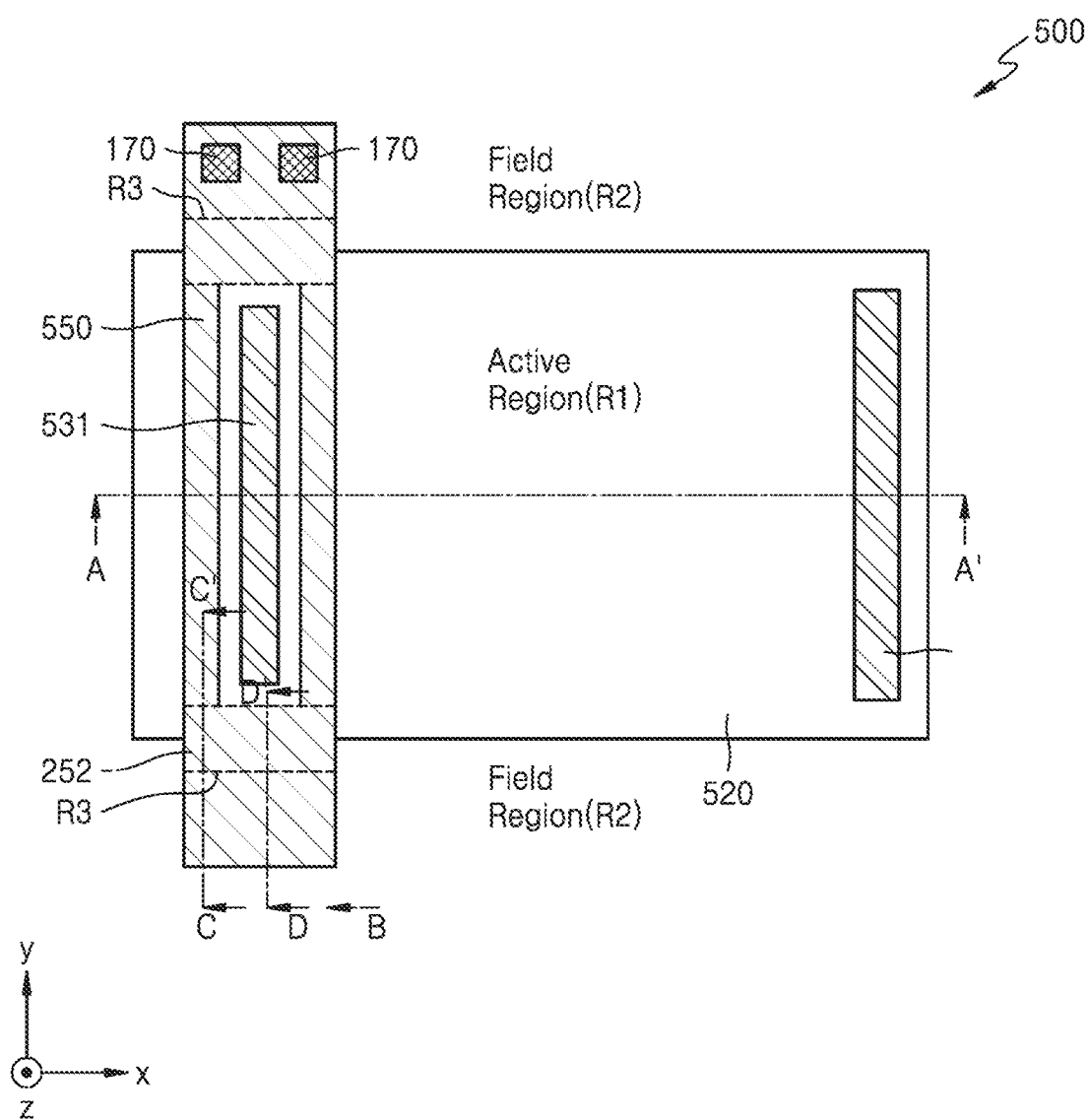
FIG. 21 is a plan view of an HEMT according to another example embodiment.
Figure 22:
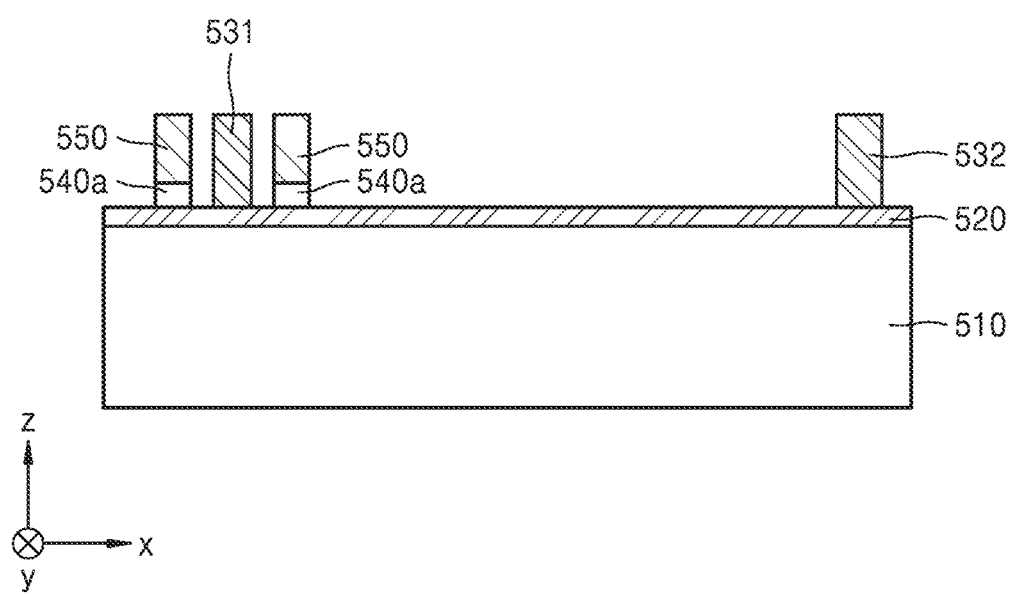
FIG. 22 is a cross-sectional view of the HEMT taken along line A-A' of FIG. 21.
Figure 23:
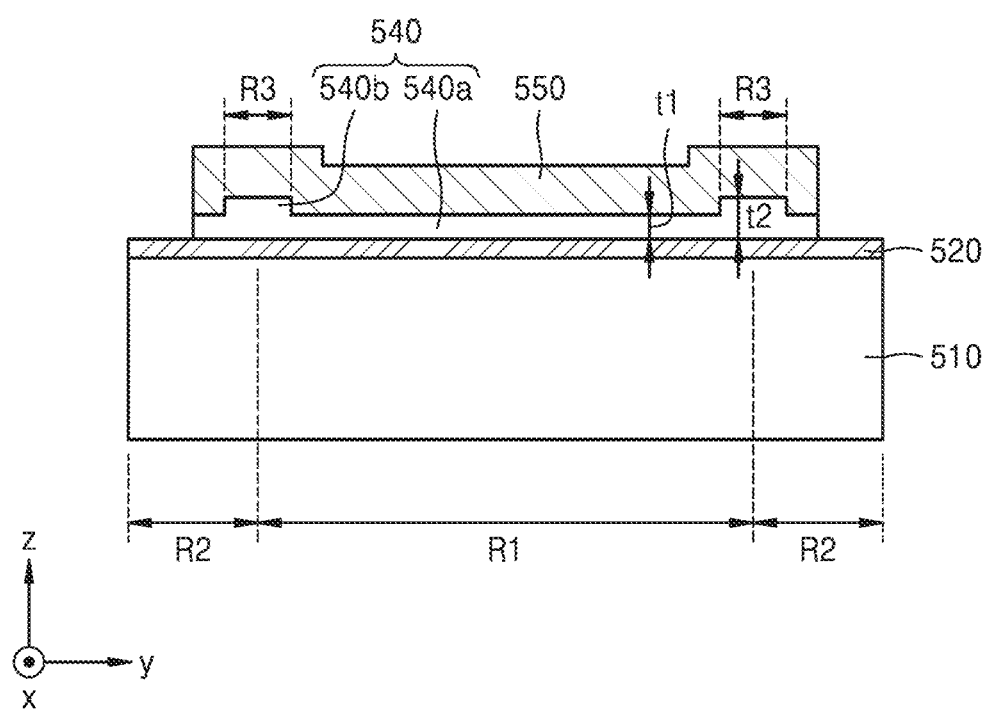
FIG. 23 is a cross-sectional view of the HEMT taken along line B-B' of FIG. 21.
Figure 24:
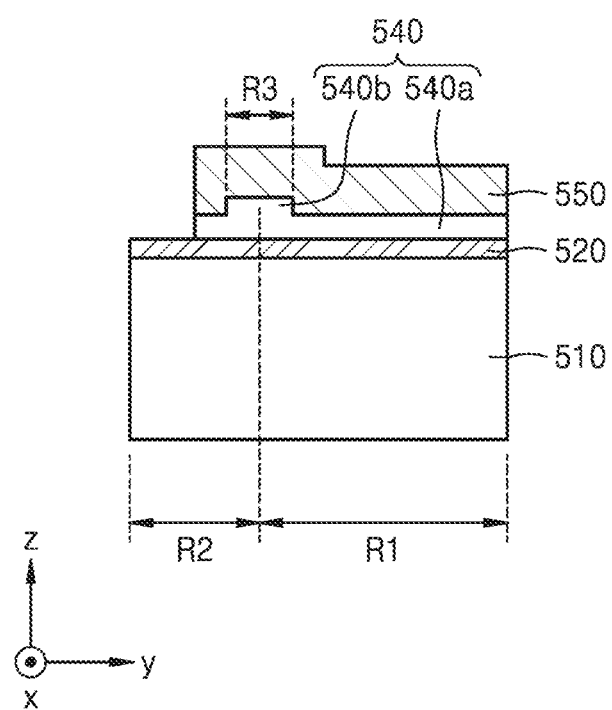
FIG. 24 is a cross-sectional view of the HEMT taken along line C-C' of FIG. 21.
Figure 25:
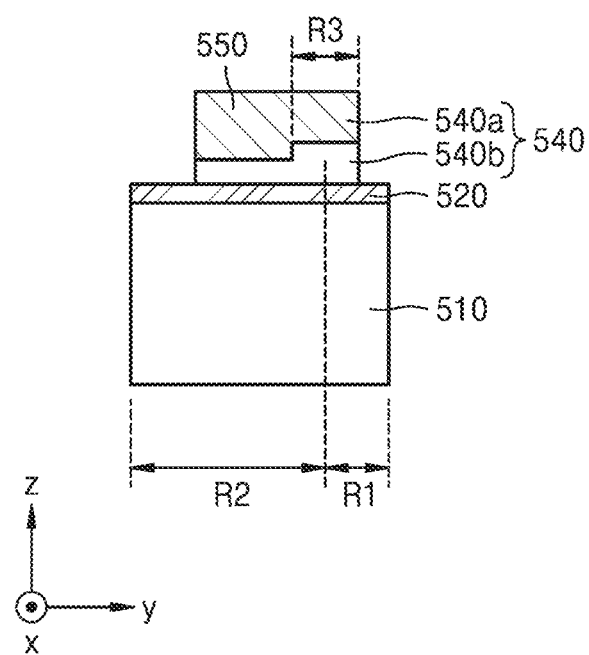
FIG. 25 is a cross-sectional view of the HEMT taken along line D-D' of FIG. 21.

FIG. 21 is a plan view of an HEMT 500 according to another example embodiment. FIG. 22 is a cross-sectional view of the HEMT 500 taken along line A-A' of FIG. 21, and FIG. 23 is a cross-sectional view of the HEMT 500 taken along line B-B' of FIG. 21. FIG. 24 is a cross-sectional view of the HEMT 500 taken along line C-C' of FIG. 21, and FIG. 25 is a cross-sectional view of the HEMT 500 taken along line D-D' of FIG. 21.

Referring to FIGS. 21 to 25, the HEMT 500 includes a channel layer 510, a barrier layer 520 provided on the channel layer 510, a source 531 and a drain 532 provided on the barrier layer 520, a depletion forming layer 540 provided on the barrier layer 520, and a gate 550 provided on the depletion forming layer 540. Because the channel layer 510, the barrier layer 520, the source 531, and the drain 532 have been described above, descriptions thereof are omitted.

The depletion forming layer 540 is provided on the barrier layer 520, and the gate 550 is provided on the depletion forming layer 540. The depletion forming layer 540 and the gate 550 may be provided so as to surround the source 531.

The depletion forming layer 540 may be provided to protrude from an active region R1 to a field region R2. The depletion forming layer 540 may include a first depletion forming layer 540a provided in the active region R1 and a second depletion forming layer 540b provided in a boundary region R3 between the active region R1 and the field region R2. The first depletion forming layer 540a may have a thickness different from that of the second depletion forming layer 540b. Specifically, the first depletion forming layer 540a provided in the active region R1 may have a first thickness (t1), and the second depletion forming layer 540b provided in the boundary region R3 between the active region R1 and the field region R2 may have a second thickness (t2) greater than the first thickness (t1).

The gate 550 is provided on the depletion forming layer 540. Like the depletion forming layer 340, the gate 550 may be provided to protrude from the active region R1 to the field region R2. The gate 550 may include a material forming a Schottky barrier with the depletion forming layer 540 thereunder. For example, the gate 550 may include TiN, Ni, W, Mo, Pd, or Pt, but the present disclosure is not limited.

In the HEMT 500 according to the present embodiment, the first depletion forming layer 540a provided in the active region R1 is formed to be thinner than the second depletion forming layer 540b provided in the boundary region R3 between the active region R1 and the field region R2. Therefore, a threshold voltage of a main transistor formed in the active region R1 may be lowered, and a current-voltage characteristic curve without a hump may be obtained. Also, because the depletion forming layer 540 is provided so as to surround the source 531, the effect of the edge transistor formed in the boundary region between the active region R1 and the field region R2 may be limited and/or suppressed more effectively.

Figure 26:
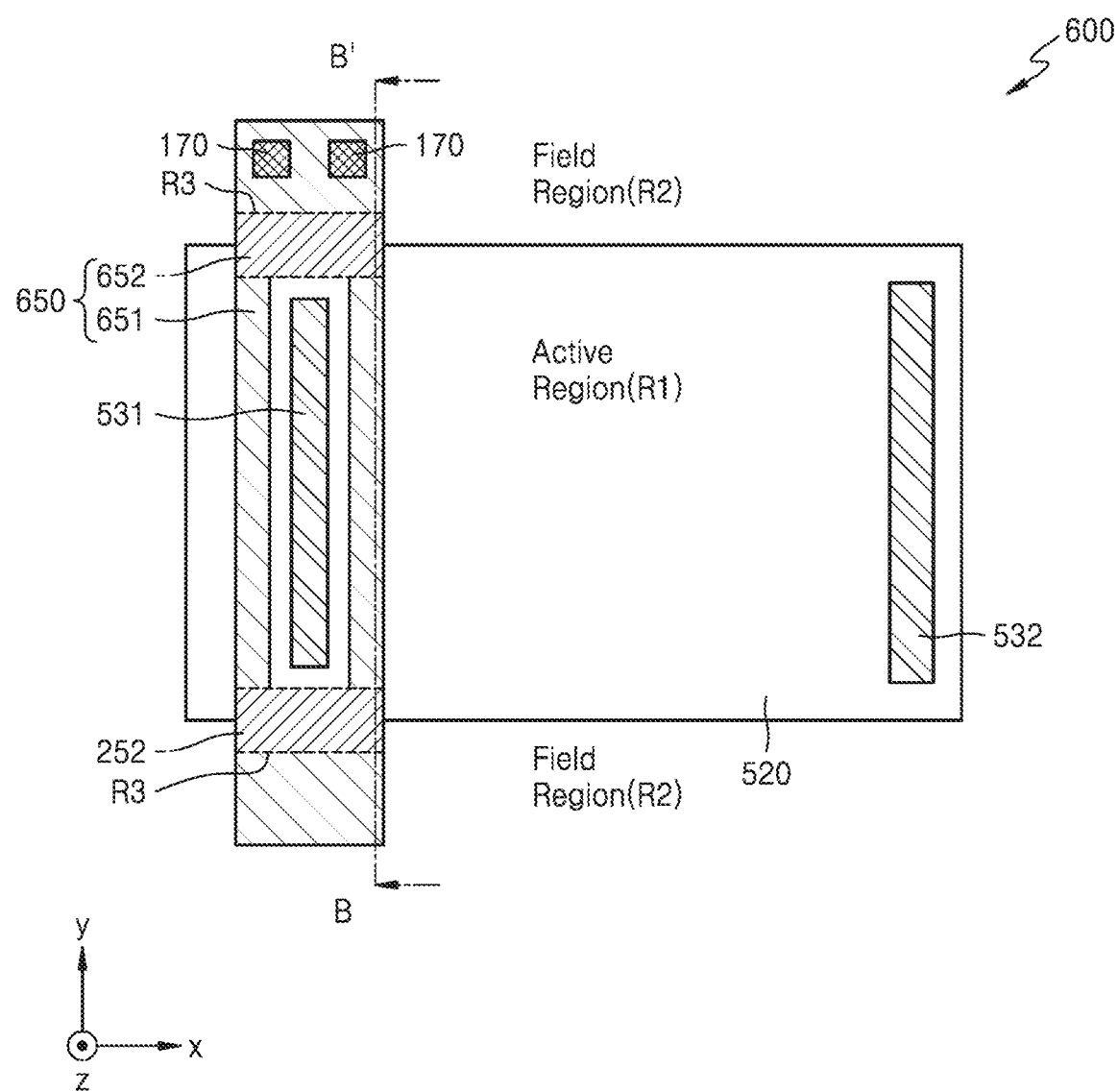
FIG. 26 is a plan view of an HEMT according to another example embodiment.
Figure 27:
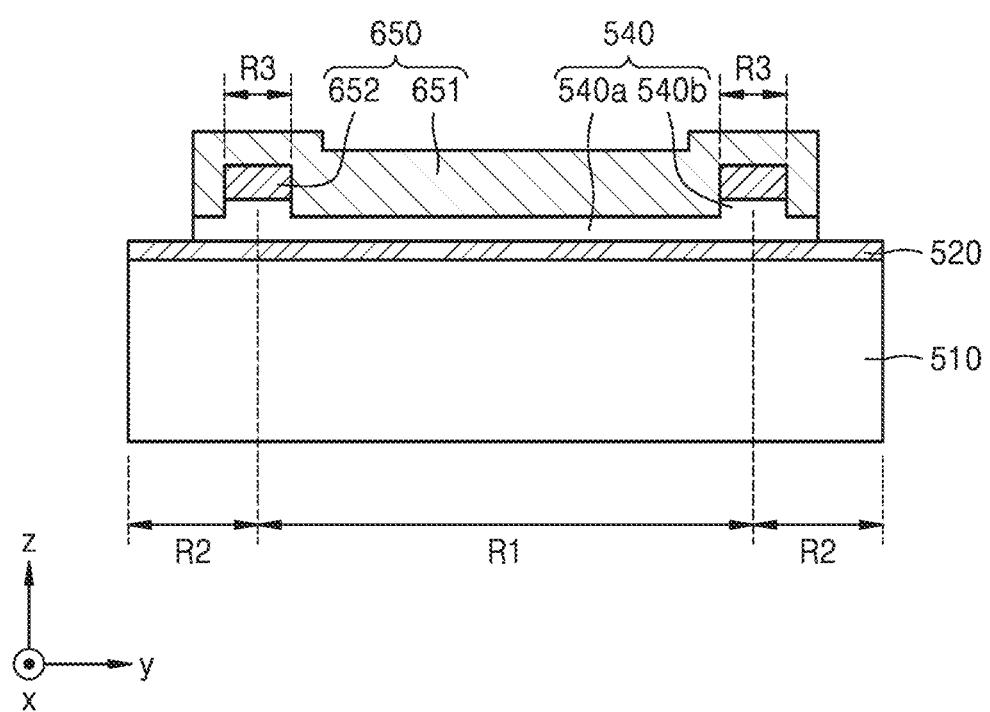
FIG. 27 is a cross-sectional view of the HEMT taken along line B-B' of FIG. 26.

FIG. 26 is a plan view of an HEMT 600 according to another example embodiment. FIG. 27 is a cross-sectional view of the HEMT 600 taken along line B-B' of FIG. 26. Hereinafter, differences from the above-described embodiments will be mainly described.

Referring to FIGS. 26 and 27, a depletion forming layer 540 is provided on a barrier layer 520, and a gate 650 is provided on the depletion forming layer 540. The depletion forming layer 540 and the gate 650 may be provided so as to surround a source 531.

The depletion forming layer 540 may be provided to protrude from an active region R1 to a field region R2. The depletion forming layer 540 may include a first depletion forming layer 540a provided in the active region R1 and a second depletion forming layer 540b provided in a boundary region R3 between the active region R1 and the field region R2. As described above, the first depletion forming layer 540a provided in the active region R1 may have a thickness less than that of the second depletion forming layer 540b provided in the boundary region R3 between the active region R1 and the field region R2.

The gate 650 is provided on the depletion forming layer 540. Like the depletion forming layer 540, the gate 650 may be provided to protrude from the active region R1 to the field region R2. The gate 650 may include a first gate 651 provided in the active region R1 and a second gate 652 provided in the boundary region R3 between the active region R1 and a field region R2.

The first and second gates 651 and 652 may be provided to form a Schottky barrier with the depletion forming layer 540 thereunder. As described above, the first and second gates 651 and 652 may include materials having different work functions from each other. Specifically, the second gate 652 may include a material having a work function lower than that of the first gate 651. The first and second gates 651 and 652 may include, for example, a material having a work function of about 4.0 eV to about 6.0 eV. For example, the first and second gates 651 and 652 may include TiN, Ni, W, Mo, Pd, or Pt. However, the present disclosure is not limited thereto.

In the HEMT 600 according to the present embodiment, because the first depletion forming layer 540a provided in the active region R1 may be formed to be thinner than the second depletion forming layer 540b provided in the boundary region R3 between the active region R1 and the field region R2, the threshold voltage of the main transistor formed in the active region R1 may decrease. Also, because the gate 650 includes the first and second gates 651 and 652 including materials having different work functions from each other, the threshold voltage of the edge transistor formed in the boundary region R3 between the active region R1 and the field region R2 may increase. Because the depletion forming layer 540 is provided so as to surround the source 531, the effect of the edge transistor formed in the boundary region between the active region R1 and the field region R2 may be limited and/or suppressed more effectively.

Figure 28:
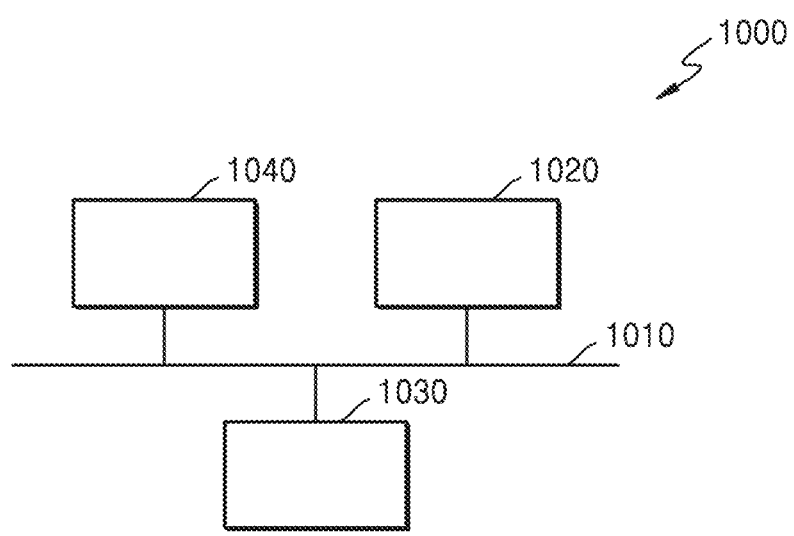
FIG. 28 is a schematic of an electronic device according to an embodiment.

FIG. 28 is a schematic of an electronic device according to an embodiment.

Referring to FIG. 28, the electronic device 1000 includes one or more electronic device components, including processing circuitry 1020 and a memory 1030 that are communicatively coupled together via a bus 1010.

The processing circuitry 1020, may be implemented by one or more instances of processing circuitry such as hardware including logic circuits, a hardware/software combination such as a processor executing software; or a combination thereof. For example, the processing circuitry 1020 may include, but is not limited to, a central processing unit (CPU), an application processor (AP), an arithmetic logic unit (ALU), a graphic processing unit (GPU), a digital signal processor, a microcomputer, a field programmable gate array (FPGA), a System-on-Chip (SoC) a programmable logic unit, a microprocessor, or an application-specific integrated circuit (ASIC), etc. In some example embodiments, the memory 1030 may include a non-transitory computer readable storage device, for example a solid state drive (SSD), storing a program of instructions, and the processing circuitry 1020 may be configured to execute the program of instructions to implement the functionality of the electronic device 1000.

In some example embodiments, the electronic device 1000 may include one or more additional components 1040, coupled to bus 1010, which may include, for example, a power supply, a light sensor, a light-emitting device, any combination thereof, or the like. In some example embodiments, one or more of the processing circuitry 1020, memory 1030, or one or more additional components 1040 may include a HEMT according to any of the HEMTs described herein.

The HEMTs according to example embodiments may be used in parts requiring transistors, including radio frequency integrated circuits (RFICs) and RF devices that use radio frequencies such as mobile communication and satellite communication, and power management integrated circuits (PMICs) and power semiconductor devices that control power. The HEMTs according to the example embodiments may be used in power semiconductor parts, such as mobile-oriented emergency charger, server-oriented switching converter used for power, vehicle-oriented charger, vehicle-oriented sensor for light detection and ranging (LiDAR), and robots.

Although the embodiments have been described above, these are only examples, and various modifications may be made thereto by those of ordinary skill in the art.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A high electron mobility transistor (HEMT) including an active region, in which a channel is formed, and a field region surrounding the active region, the HEMT comprising:
a channel layer;
a barrier layer on the channel layer and configured to induce a two-dimensional electron gas (2DEG) in the channel layer;
a source and a drain spaced apart from each other in a first direction on the barrier layer in the active region; and
a gate on the barrier layer, the gate protruding from the active region to the field region, wherein
the gate comprises a first gate and a second gate,
the first gate is in the active region,
the second gate is in a boundary region of the HEMT between the active region and the field region,
a first sidewall of the second gate and a second sidewall of the second gate are opposite each other in a second direction,
the second direction crosses the first direction,
the first gate is in contact with the first sidewall of the second gate at a location over the active region,
a work function of the second gate is different from a work function of the first gate, and
the first gate is in contact with the second sidewall of the second gate or one sidewall of the first gate is coplanar with the second sidewall of the second gate.

2. The HEMT of claim 1, wherein a material of the second gate has a work function that is lower than a work function of a material of the first gate.

3. The HEMT of claim 1, wherein the first gate and the second gate include a material that forms a Schottky barrier with an underlying layer.

4. The HEMT of claim 1, wherein the channel layer includes a gallium nitride (GaN)-based material, and
the barrier layer includes a nitride including at least one of aluminum (Al), gallium (Ga), indium (In), and boron (B).

5. The HEMT of claim 1, further comprising:
a depletion forming layer between the channel layer and the gate, wherein
the depletion forming layer is configured to form a depletion region in the 2DEG.

6. The HEMT of claim 5, wherein the depletion forming layer includes a p-type Group III-V-based nitride semiconductor.

7. The HEMT of claim 1, wherein the gate is between the source and the drain, and the gate is parallel to the source and the drain.

8. The HEMT of claim 1, wherein the gate surrounds the source.

9. The HEMT of claim 1, wherein the first gate covers the second gate or the first gate does not cover the second gate.

10. The HEMT of claim 5, wherein a thickness of the depletion forming layer in the active region is different from a thickness of the depletion forming layer in the boundary region.

11. The HEMT of claim 10, wherein a thickness of the depletion forming layer in the active region is less than a thickness of the depletion forming layer in the boundary region between the active region and the field region.

12. The HEMT of claim 10, wherein the gate comprises a first gate and a second gate, the first gate is in the active region,
the second gate is in the boundary region between the active region and the field region, and
a work function of the first gate is different from a work function of the second gate.

13. The HEMT of claim 12, wherein a material of the second gate includes has a lower work function lower than a material of the first gate.

14. The HEMT of claim 10, wherein the gate and the depletion forming layer are between the source and the drain and
the gate and the depletion forming layer are parallel to the source and the drain.

15. The HEMT of claim 10, wherein the gate and the depletion forming layer surround the source.

16. A high electron mobility transistor (HEMT) including an active region, in which a channel is formed, and a field region surrounding the active region, the HEMT comprising:
a channel layer;
a barrier layer on the channel layer and configured to induce a two-dimensional electron gas (2DEG) in the channel layer;
a source and a drain spaced apart from each other in a first direction on the barrier layer in the active region; and
a gate on the barrier layer, wherein
the gate extends over the active region to the field region,
the gate includes a first gate over the active region and a second gate extending over a boundary region of the HEMT between the active region and the field region,
the first gate and the second gate have different work functions from each other,
a first sidewall of the second gate and a second sidewall of the second gate are opposite each other in a second direction,
the second direction crosses the first direction,
the first gate is in contact with the first sidewall of the second gate at a location over the active region, and
the first gate is in contact with the second sidewall of the second gate or one sidewall of the first gate is coplanar with the second sidewall of the second gate.

17. The HEMT of claim 16, further comprising:
a depletion forming layer on the barrier layer between the gate and the barrier layer, wherein
the depletion forming layer is configured to form a depletion region in the 2DEG.

18. The HEMT of claim 17, wherein
a thickness of the depletion forming layer in the active region is different from a thickness of the depletion forming layer in the boundary region of the HEMT between the active region and the field region.

19. The HEMT of claim 16, wherein
the first gate is in contact with the second sidewall of the second gate.

20. The HEMT of claim 16, wherein
the gate surrounds the source.

* * * * *